United States Patent
Balasubramanian et al.

(10) Patent No.: US 11,170,864 B2
(45) Date of Patent: Nov. 9, 2021

(54) METHODS AND APPARATUS TO IMPROVE PERFORMANCE WHILE READING A ONE-TIME-PROGRAMMABLE MEMORY

(71) Applicant: TEXAS INSTRUMENTS INCORPORATED, Dallas, TX (US)

(72) Inventors: Suresh Balasubramanian, Dallas, TX (US); Stephen Wayne Spriggs, Murphy, TX (US); George B. Jamison, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/728,975

(22) Filed: Dec. 27, 2019

(65) Prior Publication Data

US 2020/0265906 A1   Aug. 20, 2020

Related U.S. Application Data

(60) Provisional application No. 62/807,537, filed on Feb. 19, 2019.

(51) Int. Cl.
*G11C 17/00* (2006.01)
*G11C 17/18* (2006.01)
(Continued)

(52) U.S. Cl.
CPC ............ *G11C 17/18* (2013.01); *G11C 17/16* (2013.01); *H03K 17/6872* (2013.01); *H03K 17/693* (2013.01)

(58) Field of Classification Search
CPC ................................ G11C 17/18; G11C 17/16
See application file for complete search history.

(56) References Cited

U.S. PATENT DOCUMENTS 6,483,352 B1 * 11/2002 Kuo .................... G11C 7/062
                                                              327/51
6,937,495 B2    8/2005 Scheuerlein
(Continued)

FOREIGN PATENT DOCUMENTS

CN          102534199 B        8/2013

OTHER PUBLICATIONS

Texas Instruments, "8.5.1.7 Non-Volatile Memory" (pp. 75-77) & "8.5.1.8 Error Check and Correct (ECC) OTP" (pp. 77-81), "BQ79606A-Q1 SafeTI™ Precision Monitor With Integrated Hardware Protector for Automotive Battery Pack Applications," Apr. 2019 (269 pages).
(Continued)

*Primary Examiner* — Pho M Luu
(74) *Attorney, Agent, or Firm* — Valerie M. Davis; Charles A. Brill; Frank D. Cimino

(57) ABSTRACT

Methods, apparatus, systems and articles of manufacture are disclosed that improve performance while reading memory. The method includes initializing an output of a of a sensing circuit to be a first logic high value, obtaining, from the memory, a first current corresponding to a memory bit stored in the memory, replicating the first current, determining whether the replicated first current is greater than a second current, and in response to determining that the replicated first current is greater than the second current, generating a second logic high value at the output of the sensing circuit.

44 Claims, 12 Drawing Sheets

(51) Int. Cl.
*H03K 17/687* (2006.01)
*H03K 17/693* (2006.01)
*G11C 17/16* (2006.01)

(56) References Cited

U.S. PATENT DOCUMENTS

| | | |
|---|---|---|
| 7,411,810 B2 | 8/2008 | Kim |
| 8,077,521 B2 * | 12/2011 | Bode .................. G11C 16/3418 |
| | | 365/185.21 |
| 10,795,397 B2 * | 10/2020 | Kitani .................... G11C 5/147 |

OTHER PUBLICATIONS

PCT Search Report dated Jun. 11, 2020.

* cited by examiner

METHODS AND APPARATUS TO IMPROVE PERFORMANCE WHILE READING A ONE-TIME-PROGRAMMABLE MEMORY

RELATED APPLICATION

This patent application claims the benefit of and priority to U.S. Provisional Patent Application Ser. No. 62/807,537 filed on Feb. 19, 2019, which is hereby incorporated herein by reference in its entirety.

FIELD OF THE DISCLOSURE

This disclosure relates generally to memory, and, more particularly, to methods and apparatus to improve performance while reading a one-time-programmable memory.

BACKGROUND

Memory often includes an array of memory cells each accessible via enabling a corresponding word line and a bit line pair. A memory cell often includes a word line switching device and a storage element. In a one-time-programmable (OTP) memory, the word line switching device is a metal-oxide semiconductor field-effect-transistor (MOSFET) and the storage element is a floating-gate MOSFET (FGMOS).

Figure 1:
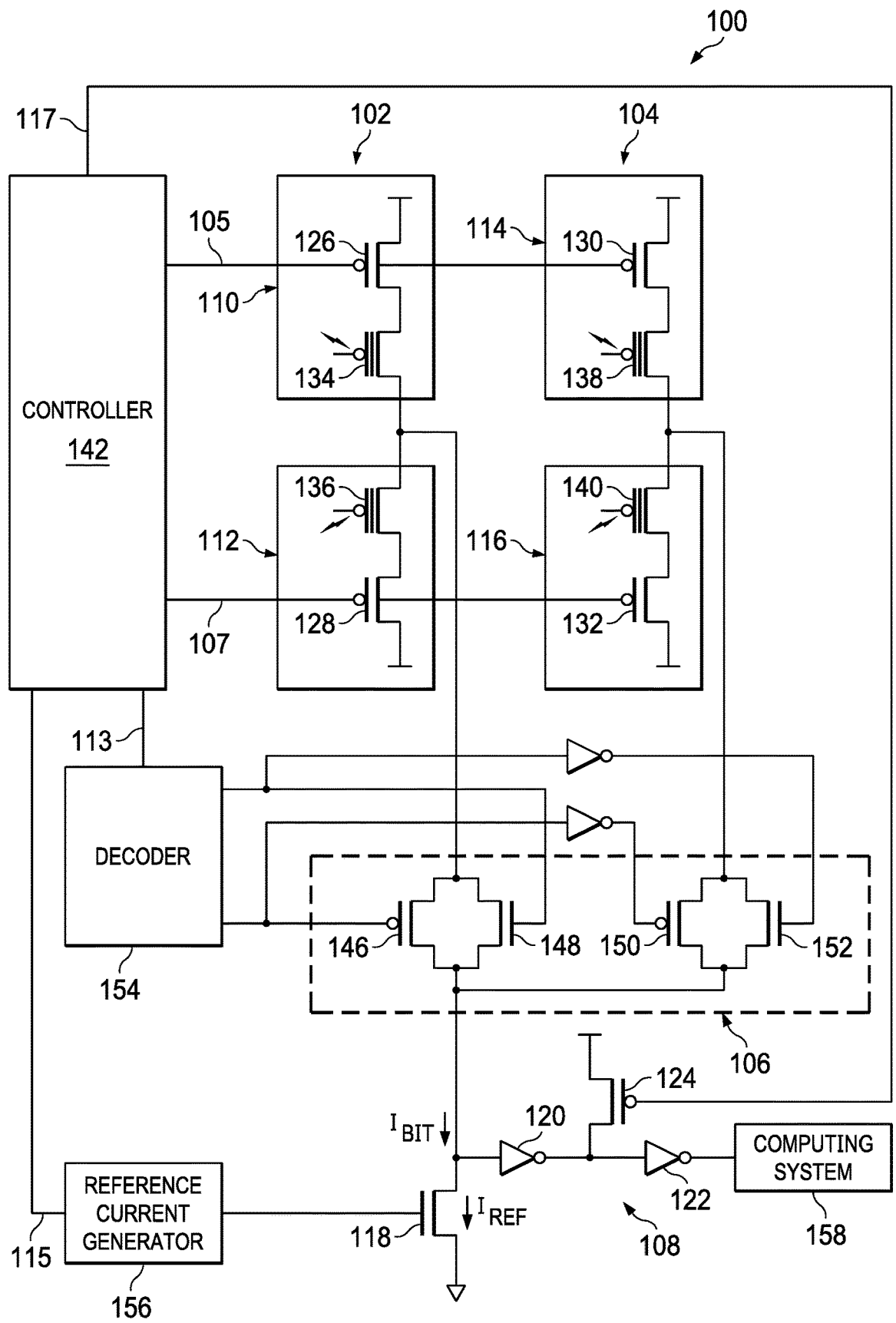
FIG. 1 is a schematic illustration of an OTP memory cell and a corresponding sensing circuit to read the OTP memory cell.

The figures are not to scale. In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Memory cells are utilized to store binary digital data (e.g., a bit value of 1 or a bit value of 0, a logic high value or a logic low value, etc.) in computing devices and/or any suitable computing architecture (e.g., microcontrollers, etc.). A memory cell may be included in an array of memory cells located in a volatile memory (e.g., random-access memory (RAM), dynamic random-access memory (DRAM), static random-access memory (SRAM), etc.) or in a non-volatile memory (e.g., read-only memory (ROM), mask ROM, programmable read-only memory (PROM), OTP memory, erasable programmable read-only memory (EPROM), electrically erasable programmable read-only memory (EEPROM), flash memory, etc.).

As discussed previously, an OTP memory is a type of non-volatile memory that is programmable by an end user. An OTP memory array may include one or more memory cells each including one or more storage devices (e.g., FGMOS). A non-volatile memory such as an OTP memory stores binary data representative of firmware code and/or low-level programs that are for read-only access. In the event such firmware code and/or any low-level programs are to be utilized, the corresponding memory bits stored in the memory cells may be sensed and/or otherwise read for use in volatile memory or elsewhere in a computing system and/or computing device.

An approach to read a memory cell in an OTP memory (e.g., sense the value of a memory bit stored in the memory cell) involves a comparison of a bit current (e.g., a current resulting from a memory bit stored in a memory cell) with a reference current. Based on such a comparison, a determination can be made of the bit value being stored in the memory cell (e.g., a bit value of 1 or a bit value of 0). For example, such a comparison determines whether the memory cell is storing a bit value of 1 or a bit value of 0.

FIG. 1, as described hereinbelow, illustrates an OTP memory along with a conventional sensing circuit.

FIG. 1 is a schematic illustration 100 of a first OTP memory array 102, a second OTP memory array 104, a multiplexor 106, and a sensing circuit 108. In FIG. 1, the first OTP memory array 102 includes a first OTP memory cell 110 and a second OTP memory cell 112. Likewise, in FIG. 1, the second OTP memory array 104 includes a third OTP memory cell 114 and a fourth OTP memory cell 116. Furthermore, the sensing circuit 108 includes a first reference switch 118, a first logic gate 120, a second logic gate 122, and a second reference switch 124.

In FIG. 1, the first OTP memory cell 110, the second OTP memory cell 112, the third OTP memory cell 114, and the fourth OTP memory cell 116 include respective p-channel MOSFET (PMOS) 126, 128, 130, 132.

Furthermore, the first OTP memory cell 110, the second OTP memory cell 112, the third OTP memory cell 114, and the fourth OTP memory cell 116 include respective FGMOS switches 134, 136, 138, 140. In FIG. 1, a controller 142 is operable to load a respective memory bit in any of the first OTP memory cell 110, the second OTP memory cell 112, the third OTP memory cell 114, and/or the fourth OTP memory cell 116 via a first word line (line 105) or a second word line (line 107).

In FIG. 1, the multiplexor 106 is a two-to-one passthrough multiplexor including first array PMOS switch 146, a first array n-channel MOSFET (NMOS) switch 148, a second array PMOS switch 150, a second array NMOS switch 152, and a decoder 154. The multiplexor 106 is operable based on a memory address value associated with the control signal (line 113), as decoded by the decoder 154, to either conduct current through the first array PMOS switch 146 and the first array NMOS switch 148 or conduct current through the second array PMOS switch 150 and the second array NMOS switch 152.

In order to read the bit value stored in a selected one of the first OTP memory cell 110, the second OTP memory cell 112, the third OTP memory cell 114, or the fourth OTP memory cell 116, the controller 142 generates the control signal (line 113) for use by the multiplexor 106 to enable and/or disable the respective first array PMOS switch 146, the first array NMOS switch 148, the second array PMOS switch 150, or the second array NMOS switch 152. At substantially the same time (e.g., within microseconds), a reference signal (line 115) is transmitted to a reference current generator 156. In operation, the reference signal (line 115) indicates to the reference current generator 156 to enable the first reference switch 118. As such, a reference current ($I_{REF}$) will conduct through the first reference switch 118. Likewise, the multiplexor 106, based on the memory address value associated with the control signal (line 113) and whether a memory bit is stored in a selected one of the first OTP memory cell 110, the second OTP memory cell 112, the third OTP memory cell 114, or the fourth OTP memory cell 116, conducts a bit current ($I_{BIT}$). In FIG. 1, when a memory bit is stored in a selected one of the first OTP memory cell 110, the second OTP memory cell 112, the third OTP memory cell 114, or the fourth OTP memory cell 116, the bit current ($I_{BIT}$) is a fixed current. In FIG. 1, each of the multiplexor 106, the first OTP memory cell 110, the second OTP memory cell 112, the third OTP memory cell 114, and the fourth OTP memory cell 116 are rated for a substantially higher voltage than the sensing circuit 108, the reference current generator 156, and the computing system 158 (e.g., 5 V vs. 1.5 V).

In FIG. 1, the polarity of the input of the second logic gate 122 is initialized to a high value via the enabling of the second reference switch 124. An initializing signal (line 117) is sent to the second reference switch 124 to enable the second reference switch 124. In operation, if the bit current ($I_{BIT}$) is higher as compared to the reference current ($I_{REF}$), then the voltage at the input terminal of the first logic gate 120 will be pulled to a logic high value. As such, the first logic gate 120 will obtain a high input voltage value. The output of the first logic gate 120, thus the input of the second logic gate 122, will be a low output value. Therefore, the output of the second logic gate 122 will be a high output value. Such an output of the second logic gate 122 indicates a memory bit is stored in the selected one of the first OTP memory cell 110, the second OTP memory cell 112, the third OTP memory cell 114, or the fourth OTP memory cell 116. If the bit current ($I_{BIT}$) is lower as compared to the reference current ($I_{REF}$), then the voltage of the input terminal of the first logic gate 120 will be affected by the dominating larger reference current ($I_{REF}$) conducting to ground, thus causing the input terminal of the first logic gate 120 to be a logic low value. As such, the first logic gate 120 will obtain a low input voltage value. As such, the output of the first logic gate 120, thus the input of the second logic gate 122, will be a high output value. Therefore, the output of the second logic gate 122 will be a low output value. Such an output of the second logic gate 122 indicates a memory bit is not stored in the selected one of the first OTP memory cell 110, the second OTP memory cell 112, the third OTP memory cell 114, or the fourth OTP memory cell 116.

In FIG. 1, the comparison of the bit current ($I_{BIT}$) with the reference current ($I_{REF}$) is inefficient and time consuming. In FIG. 1, the difference between the bit current ($I_{BIT}$) and the reference current ($I_{REF}$), when a memory bit "1" is read, determines the rate of change of the voltage at the input terminal of the first logic gate 120. In FIG. 1, the access time (e.g., the time it takes to read and/or sense the data, instructions, and information stored in the first OTP memory array 102 and/or the second OTP memory array 104) and the cycle time (e.g., the time between one access of either the first OTP memory array 102 or the second OTP memory array 104 and a succeeding access to the first OTP memory array 102 or the second OTP memory array 104) are dependent on the magnitude and/or otherwise amount of bit current ($I_{BIT}$) available. Therefore, the access time and cycle time are dependent on, and thus limited due to the time it takes for the bit current ($I_{BIT}$) to cause the voltage at the input terminal of the logic gate 120 to rise to the logic high value. In FIG. 1, the access time for and cycle time for a 1024 16-bit word is slow (e.g., around a 58 nanoseconds (ns) access time and a 125 ns cycle time).

As illustrated in FIG. 1, the time to access the first OTP memory cell 110, the second OTP memory cell 112, the third OTP memory cell 114, and/or the fourth OTP memory cell 116 is excessive and a processor, central processing unit (CPU), and/or other computing system cannot reliably utilize the memory bits, instructions, and/or other information stored in the first OTP memory cell 110, the second OTP memory cell 112, the third OTP memory cell 114, and/or the fourth OTP memory cell 116. Thus, the memory bits, instructions, and/or other information stored in the first OTP memory cell 110, the second OTP memory cell 112, the third OTP memory cell 114, and/or the fourth OTP memory cell 116 are loaded into computing system 158 for use by a processor, CPU, and/or other computing system.

Examples disclosed herein include methods and apparatus to improve the efficiency when sensing and/or otherwise reading bit stored in memory. In examples disclosed herein, a current mirror is utilized to boost an incoming bit current to improve the access time and the cycle time when sensing and/or otherwise reading bits stored in an OTP memory. For example, rather than the bit current ($I_{BIT}$) being a source current, as in FIG. 1, a current mirror may be utilized in a sensing circuit to replicate and boost the bit current ($I_{BIT}$) obtained from an OTP memory. In this manner, the bit current ($I_{BIT}$) may be sensed as a sink current. Such an example current mirror may include a combination of switching devices (e.g., transistors) selected in a manner to ensure the incoming bit current ($I_{BIT}$) is boosted when replicated. For example, switching devices (e.g., transistors) in the current mirror may be selected having specified characteristics (e.g., transistor size, etc.) to ensure a desired boost ratio of the bit current ($I_{BIT}$). In examples disclosed herein, the boosted, replicated bit current (Inn) conducting as a sink current is used in comparison with a reference current. As a result, operational characteristics such as the cycle time and access time of a sensing circuit are reduced and improved. Further operational description is described below.

In some examples disclosed herein, the improved access time and the cycle time when sensing, comparing, and/or otherwise reading bits stored in an OTP memory enable efficient operation of the OTP memory regardless of whether a shadow volatile memory is utilized.

Figure 2:
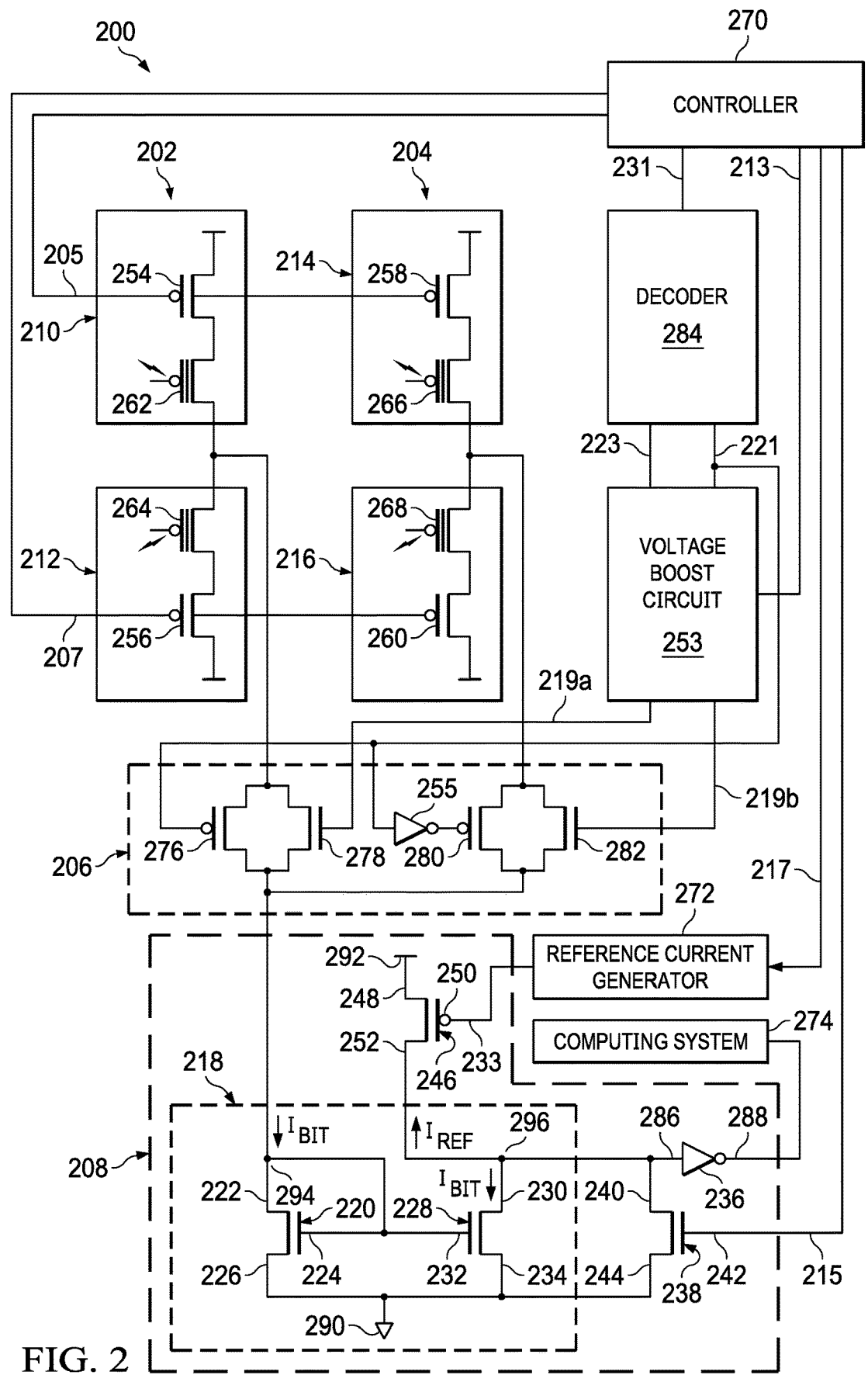
FIG. 2 is a schematic illustration of an example OTP memory and an example sensing circuit to read the OTP memory.

FIG. 2 is a schematic illustration 200 of an example first OTP memory array 202, an example second OTP memory array 204, an example multiplexor 206, and an example sensing circuit 208. In FIG. 2, the first OTP memory array 202 includes an example first OTP memory cell 210 and an example second OTP memory cell 212. Likewise, in FIG. 2, the second OTP memory array 204 includes an example third OTP memory cell 214 and an example fourth OTP memory cell 216. Furthermore, the sensing circuit 208 includes an example current mirror 218 including an example first switch 220 having an example first drain terminal 222, an example first gate terminal 224, and an example first source terminal 226. The current mirror 218 further includes an example second switch 228 including an example second drain terminal 230, an example second gate terminal 232, and an example second source terminal 234. The sensing circuit 208 further includes an example logic gate 236, an example initializing switch 238 having an example third drain terminal 240, an example third gate terminal 242, and an example third source terminal 244. In addition, the sensing circuit 208 includes an example reference switch 246 having an example fourth source terminal 248, an example fourth gate terminal 250, and an example fourth drain terminal 252. The first switch 220, the second switch 228, and the initializing switch 238 are an NMOS transistors. The reference switch 246 is a PMOS transistor. In other examples disclosed herein, the first switch 220, the second switch 228, the initializing switch 238, and/or the reference switch 246 may be any suitable switching device (e.g., a PMOS transistor, an NMOS transistor, a bipolar junction gate transistor (BJT), etc.).

In addition, the schematic illustration 200 of FIG. 2 includes an example voltage boost circuit 253 and an example inverter 255. In examples disclosed herein, any of the first drain terminal 222, the first source terminal 226, the second drain terminal 230, the second source terminal 234, the third drain terminal 240, the third source terminal 244, the fourth drain terminal 252, and/or the fourth source terminal 248 may be referred to as respective current terminals. In other examples disclosed herein, any suitable logic device and/or circuitry may be utilized in combination with the system of FIG. 2. An example additional implementation including additional logic circuitry is depicted below, in FIG. 10.

In FIG. 2, the first OTP memory cell 210, the second OTP memory cell 212, the third OTP memory cell 214, and the fourth OTP memory cell 216 include respective p-channel metal-oxide-semiconductor field-effect transistors (PMOS) 254, 256, 258, 260. Furthermore, the first OTP memory cell 210, the second OTP memory cell 212, the third OTP memory cell 214, and the fourth OTP memory cell 216 include respective FGMOS switches 262, 264, 266, 268. In FIG. 2, the controller 270 is operable to load a respective memory bit in any of the first OTP memory cell 210, the second OTP memory cell 212, the third OTP memory cell 214, and/or the fourth OTP memory cell 216 via an example first word line (line 205) or an example second word line (line 207). In the example illustrated in FIG. 2, in response to the generation of any of the first word line (line 205) or the second word line (line 207), a charge is stored in the floating gate of the respective FGMOS switches 262, 264, 266, 268.

In the example of FIG. 2, the first OTP memory array 202, the second OTP memory array 204, and the multiplexor 206 are rated for a higher voltage (e.g., 5 volts) than voltage rating of the sensing circuit 208 (e.g., 1.5 volts). While FIG. 2 illustrates the first OTP memory array 202, the second OTP memory array 204, and the multiplexor 206 rated for a higher voltage (e.g., 5 volts) than the voltage rating of the sensing circuit 208 (e.g., 1.5 volts), any suitable voltage ratings may be utilized to implement the first OTP memory array 202, the second OTP memory array 204, the multiplexor 206, and/or the sensing circuit 208.

The schematic illustration 200 of FIG. 2 also includes an example controller 270, an example reference current generator 272, and an example computing system 274. In other examples disclosed herein, there may be any number of OTP memory arrays configured in the schematic illustration 200.

In FIG. 2, the multiplexor 206 is a two-to-one passthrough multiplexor including an example first array PMOS switch 276, an example first array NMOS switch 278, an example second array PMOS switch 280, and an example second array NMOS switch 282. The multiplexor 206 is operable based on a polarity of example select signals (lines 221, 223) generated by the example decoder 284 and/or an example boosted control signal (line 219a) and an example complimented boosted control signal (line 219b) generated by the voltage boost circuit 253. In operation, the controller 270 transmits an example control signal (line 213) and the voltage boost circuit 253 generates and transmits the example boosted control signal (line 219a) and/or the example complimented boosted control signal (line 219b) to the multiplexor 206 based on the polarity of the select signal (line 221, 223). Additionally, the controller 270 transmits an example decode signal (line 231) to the decoder 284. As a result, the decoder 284 generates the select signals (lines 221, 223) based on the decode signal (line 231) to either cause conduction of current through the first array PMOS switch 276 and the first array NMOS switch 278 or conduction of current through the second array PMOS switch 280 and the second array NMOS switch 282 in conjunction with the boosted control signal (line 219a) and/or the complimented boosted control signal (line 219b).

For example, if the first word line (line 205) is a logic low value, the second word line (line 207) is a logic high value, the first select signal (line 221) is a logic high value, the second select signal (line 223) is a logic low value, and the control signal (line 213) is a logic high value, then the boosted control signal (line 219a) is a logic low value, the voltage level of the complimented boosted control signal (line 219b) is boosted and a memory bit, if any, stored in the third OTP memory cell 214 is to be sensed and/or otherwise read. Further in such an example, if a memory bit is stored in the third OTP memory cell 214 and the select signals (lines 221, 223) and/or the control signal (line 213) indicate to sense and/or otherwise read the memory bit stored in the third OTP memory cell 214, an example bit current ($I_{BIT}$) will conduct through the second array PMOS switch 280 and the second array NMOS switch 282.

Alternatively, in another example disclosed herein, if the first word line (line 205) is a logic high value, the second word line (line 207) is a logic low value, the first select signal (line 221) is a logic low value, the second select signal (line 223) is a logic high value, and the control signal (line 213) is a logic high value, then, the voltage level of the boosted control signal (line 219a) is boosted, the complimented boosted control signal (line 219b) is a logic low value, and a memory bits stored, if any, in the second OTP memory cell 212 are to be sensed and/or otherwise read. Further in such an example, if a memory bit is stored in the second OTP memory cell 212 and the select signals (line 221, 223) and/or the control signal (line 213) indicate to sense and/or otherwise read the memory bit stored in the second OTP memory cell 212, the bit current ($I_{BIT}$) will conduct through the first array PMOS switch 276 and the first array NMOS switch 278. In examples disclosed herein, the magnitude of the bit current ($I_{BIT}$) if a memory bit is stored in a selected one of the first OTP memory cell 210, the second OTP memory cell 212, the third OTP memory cell 214, or the fourth OTP memory cell 216 may be 0.5 milliamperes, 1.0 milliamperes, etc. Table 1 below illustrates example voltage values when reading a memory cell of the first OTP memory array 202.

TABLE 1

| Signal | Voltage Level (Volts) |
| --- | --- |
| Control Signal (line 213) | 1.5 |
| Boosted Control Signal (line 219a) | 2.4 |
| Complimented Boosted Control Signal (line 219b) | 0 |
| First Select Signal (line 221) | 0 |
| Second Select Signal (line 223) | 1.5 |
| Decode Signal (line 231) | 0 |

Table 2 below illustrates example voltage values when reading a memory cell of the second OTP memory array 204.

TABLE 2

| Signal | Voltage Level (Volts) |
| --- | --- |
| Control Signal (line 213) | 1.5 |
| Boosted Control Signal (line 219a) | 0 |
| Complimented Boosted Control Signal (line 219b) | 2.4 |
| First Select Signal (line 221) | 1.5 |
| Second Select Signal (line 223) | 0 |
| Decode Signal (line 231) | 1 |

In the example illustrated in FIG. 2, the sensing circuit 208 is operable to sense and/or otherwise read memory bits, if any, stored in a selected one of the first OTP memory cell 210, the second OTP memory cell 212, the third OTP memory cell 214, or the fourth OTP memory cell 216. In the example of FIG. 2, if a memory bit is stored in a selected one of the first OTP memory cell 210, the second OTP memory cell 212, the third OTP memory cell 214, or the fourth OTP memory cell 216, and such corresponding memory cell is selected to be sensed and/or otherwise read via the select signals (line 221, 223), the bit current ($I_{BIT}$) conducts through the multiplexor 206.

In FIG. 2, the current mirror 218 of the sensing circuit 208 is coupled to the multiplexor 206 (e.g., the first drain terminal 222 of the first switch 220 is coupled to the multiplexor 206) to obtain and/or otherwise receive the bit current ($I_{BIT}$) from the first OTP memory array 202 or the second OTP memory array 204. In such an example, the bit current ($I_{BIT}$) is mirrored and/or otherwise replicated to conduct through the first switch 220 and the second switch 228. Furthermore, in FIG. 2, the first switch 220 and the second switch 228 of the current mirror 218 are selected to ensure a specified boost ratio of the current mirror 218. For example, the first switch 220 may be selected having first operational characteristics (e.g., a first switch size, etc.) and the second switch 228 may be selected having second operational characteristics (e.g., a second switch size, etc.) to ensure the incoming bit current ($I_{BIT}$), when replicated, is boosted to a higher current value when conducting through the second switch 228.

In FIG. 2, because the input terminal 286 of the logic gate 236 is initialized to a logic low value, the access time and cycle time of the sensing circuit 208 depends on the reference current ($I_{REF}$) to pull up the voltage at the input terminal 286 of the logic gate 236. In the topology of FIG. 2, the difference between the reference current ($I_{REF}$) and the bit current ($I_{BIT}$), when reading a memory bit "0," affects the rate of change of the voltage at the input terminal 286 of the logic gate 236. Because the current mirror 218 is configured to boost the bit current ($I_{BIT}$), a higher reference current ($I_{REF}$) can be utilized. Due to the higher reference current ($I_{REF}$), the rate of change of the voltage at input terminal 286 of the logic gate 236 is improved (e.g., the rate of change of the voltage at the input terminal 286 of the logic gate 236 is increased). Therefore, characteristics of the sensing circuit 208 such as access time and cycle time are improved. Description of the improved operational characterizes is explained below, in connection with at least FIGS. 4, 5, and/or 6. While in FIG. 2 the first switch 220 and the second switch 228 form the current mirror 218, any suitable number of logic devices and/or logic circuitry may be utilized to implement the current mirror. For example, the current mirror 218 may be implemented using a bipolar junction transistor (BJT) current mirror, a feedback-assisted current mirror, etc. While the example of FIG. 2 illustrates the first switch 220 as a diode-connected switch coupled to the multiplexor 206, any suitable logic gate, logic device, and/or circuit may be used to implement the first switch 220. Further, in examples disclosed herein, the sensing circuit 208 may be coupled to the multiplexor 206 via an example first terminal 294 of the current mirror 218 of the sensing circuit 208. In examples disclosed herein, the first drain terminal 222 of the first switch 220, the first gate terminal 224 of the first switch 220, and the second gate terminal 232 of the second switch 228 are coupled to the first terminal 294. In addition, the input terminal 286 of the logic gate 236, the fourth drain terminal 252 of the reference switch 246, and the third drain terminal 240 of the initializing switch 238 are coupled to an example second terminal 296 of the current mirror 218.

In the example illustrated in FIG. 2, the logic gate 236 is an inverting gate. In FIG. 2, the logic gate 236 includes an example input terminal 286 and an example output terminal 288. The input terminal 286 is coupled to the second drain terminal 230, the third drain terminal 240, and the fourth drain terminal 252. The voltage value at the output terminal 288 will be the inverse of the voltage value at the input terminal 286. For example, if the voltage value at the input terminal 286 is a logic low, then the voltage value at the output terminal 288 will be a logic high. Alternatively, in another example disclosed herein, if the voltage value at the input terminal 286 is a logic high, then the voltage value at the output terminal 288 will be a logic low.

In the example illustrated in FIG. 2, the initializing switch 238 is coupled to the logic gate 236, to the current mirror 218, and to the controller 270. The initializing switch 238 is an NMOS transistor. In other examples disclosed herein, the initializing switch 238 may be any suitable switching device (e.g., PMOS transistor, bipolar junction gate transistor (BJT), etc.). In FIG. 2, the controller 270 generates and/or otherwise provides an example enable signal (line 215) to cause the initializing switch 238 to conduct current. In examples disclosed herein, prior to sensing and/or otherwise reading memory bits, if any, stored in a selected one of the first OTP memory cell 210, the second OTP memory cell 212, the third OTP memory cell 214, or the fourth OTP memory cell 216 (e.g., prior to the generation of the control signal (line 213)), the controller 270 provides the enable signal (line 215) to the initializing switch 238. As such, the initializing switch 238 causes conduction of current from the input terminal 286 of the logic gate 236 to an example ground rail 290 of the current mirror 218. As such, the voltage value at the input terminal 286 of the logic gate 236 is initialized to a logic low value. Therefore, the output terminal 288 of the logic gate 236 is initialized to a logic high value.

In FIG. 2, the example reference switch 246 is coupled to the current mirror 218, the input terminal 286 of the logic gate 236, the reference current generator 272, and to an example power rail 292. In the example of FIG. 2, the reference switch 246 is a PMOS transistor. In other examples disclosed herein, the reference switch 246 may be any suitable switching device (e.g., an NMOS, a BJT, etc.). In examples disclosed herein, the reference switch 246 is turned on, thus causing the voltage at the input terminal 286 of the logic gate 236 to be equivalent, or substantially similar, to the voltage of the power rail 292. The reference switch 246 is configured to conduct an example reference current ($I_{REF}$) from the power rail 292 to the input terminal 286 of the logic gate 236. In examples disclosed herein, the power rail 292 provides a suitable voltage to the reference switch 246 (e.g., 1.5 volts). In examples disclosed herein, the reference switch 246 is enabled in response to an example reference signal (line 217) being generated and/or otherwise provided by the controller 270. In the example illustrated in FIG. 2, the magnitude of the reference current ($I_{REF}$) may be 3 microamperes, 5, microamperes, etc., and is set and/or otherwise caused due to the voltage of the reference signal (line 217).

In the illustrated example of FIG. 2, the voltage boost circuit 253 is a circuit that applies a boost to the voltage level of the control signal (line 213). For example, if the voltage level of the control signal (line 213) is 1.5 V, the voltage boost circuit 253 applies voltage boost of about 500-900 millivolt (mV) to the control signal (line 213). The resultant control signals (e.g., the boosted control signal (line 219a) and/or the complimented boosted control signal (line 219b)) are at a voltage level between 2.0 V and 2.4 V.

In operation, the sensing circuit 208 senses and/or otherwise reads a memory bit, if any, stored in a selected one of the first OTP memory cell 210, the second OTP memory cell 212, the third OTP memory cell 214, or the fourth OTP memory cell 216 by a comparison of the bit current ($I_{BIT}$) with the reference current ($I_{REF}$). For example, if a memory bit is stored in the selected memory cell to be sensed and/or otherwise read, then the bit current ($I_{BIT}$) will be high (e.g., 7 microamperes, 50 microamperes). In such an event, because the bit current ($I_{BIT}$) is substantially higher than the reference current ($I_{REF}$) (e.g., a 7 microampere or 50 microampere bit current ($I_{BIT}$) is substantially higher than a 2 microampere or 5 microampere reference current ($I_{REF}$)), then the voltage at the input terminal 286 will be substantially similar to the voltage of the ground rail 290. For example, when the bit current ($I_{BIT}$) is greater than the reference current ($I_{REF}$), the voltage at the input terminal 286 of the logic gate 263 will be pulled to a logic low value. As a result, the voltage at the input terminal 286 will be substantially similar to the voltage and or current at the ground rail 290 (e.g., 0 volts or a logic low). Therefore, the output terminal 288 of the logic gate 236 will be a logic high and, as such, indicate a memory bit is stored in the selected memory cell.

In yet another example, if a memory bit is not stored in the selected memory cell to be sensed and/or otherwise read, then the bit current ($I_{BIT}$) will be low (e.g., 1.0 nanoampere, 0.5 nanoamperes). In such an event, because the reference current ($I_{REF}$) is substantially higher than the bit current ($I_{BIT}$) (e.g., a 3 microampere or 5 microampere reference current ($I_{REF}$) is substantially higher than a 1.0 nanoampere or 0.5 nanoampere bit current ($I_{BIT}$)), then the voltage at the input terminal 286 will be substantially similar to the voltage of the power rail 292 (e.g., a logic high value). As a result, the voltage at the input terminal 286 will be substantially similar to the voltage at the power rail 292 (e.g., 1.5 volts or a logic high). Therefore, the output terminal 288 of the logic gate 236 will be a logic low and, as such, indicate a memory bit is not stored in the selected memory cell.

In the example illustrated in FIG. 2, the controller 270 is coupled to the multiplexor 206, the first OTP memory cell 210, the second OTP memory cell 212, the third OTP memory cell 214, the fourth OTP memory cell 216, the initializing switch 238, the reference current generator 272, and to the decoder 284. In examples disclosed herein, the controller 270 is implemented as a single controller operable to, at least, load a memory bit in any of the first OTP memory cell 210, the second OTP memory cell 212, the third OTP memory cell 214, and/or the fourth OTP memory cell 216, select via the control signal (line 213) and the decode signal (line 231) which of the first OTP memory cell 210, the second OTP memory cell 212, the third OTP memory cell 214 or the fourth OTP memory cell 216 to sense and/or otherwise read, initialize via the enable signal (line 215) the sensing circuit 208, and/or generate and/or otherwise cause to generate a reference current via the reference signal (line 217). In the example of FIG. 2, the controller 270 is a central processing unit (CPU) including a memory controller. In other examples disclosed herein, any number of suitable controllers may be configured to perform the operations of the controller 270.

In FIG. 2, the controller 270 is operable to load a memory bit into any of the first OTP memory cell 210, the second OTP memory cell 212, the third OTP memory cell 214, and/or the fourth OTP memory cell 216 based on the logic values of first word line (line 205) or the second word line (line 207). In such an example, a user may indicate certain programs and/or low-level code to be translated into binary digital data by the controller 270 and stored in a selected one of the first OTP memory cell 210, the second OTP memory cell 212, the third OTP memory cell 214, or the fourth OTP memory cell 216. The controller 270 is operable to generate and/or otherwise provide the control signal (line 213) to the voltage boost circuit 253, and the decode signal (line 231) to the decoder 284 to indicate which of the first OTP memory cell 210, the second OTP memory cell 212, the third OTP memory cell 214, or the fourth OTP memory cell 216 are to be sensed and/or otherwise read (e.g., sense the memory bits, if any). In addition, the controller 270 is operable to generate and/or otherwise provide the enable signal (line 215) to the initializing switch 238 to cause the initializing switch 238 to conduct and, as such, initialize the input terminal 286 to be a logic low. Moreover, the controller 270 is operable to generate and/or otherwise provide the reference signal (line 217) to the reference current generator 272 to indicate to enable the reference switch 246 and, as such, cause conduction of the reference current ($I_{REF}$). Further operation of the controller 270 is explained in further detail below, in connection with FIG. 3.

In FIG. 2, the example reference current generator 272 is coupled to the reference switch 246 and to the controller 270. In examples disclosed herein, the reference current generator 272 is implemented external to the controller 270. Alternatively, in other examples disclosed herein, the reference current generator 272 may be implemented internal to the controller 270. The reference current generator is configured to obtain and/or otherwise receive the reference signal (line 217) that indicates the desired magnitude of the reference current ($I_{REF}$). For example, the reference signal (line 217) may indicate a desired reference current ($I_{REF}$) of 0.1 microamperes and, as such, the reference current generator 272 is configured to generate an example gate reference signal (line 233) that includes a specified voltage that will cause a change in drain-to-source resistance ($R_{DS}$) of the reference switch 246. As a result, due to the fixed voltage of the power rail 292, the current conducting through the reference switch 246 (e.g., $I_{REF}$) will be adjusted accordingly (e.g., adjusted to 0.1 milliamperes).

In some examples disclosed herein, the sensing circuit 208 (e.g., the current mirror 218, the first switch 220, the second switch 228, the logic gate 236, the initializing switch 238, and the reference switch 246), the reference current generator 272, and/or the decoder 284 may be included in the controller 270.

In the example illustrated in FIG. 2, the computing system 274 is coupled to the output terminal 288 of the logic gate 236. In examples disclosed herein, the computing system 274 may be a volatile memory configured to receive the indication of the sensed and/or otherwise read memory bit. In such examples disclosed herein, the computing system 274 can download and/or otherwise load the memory bits from any of the first OTP memory cell 210, the second OTP memory cell 212, the third OTP memory cell 214, and/or the fourth OTP memory cell 216 for reprogramming, use, and/or any other suitable application. In other examples disclosed herein, the computing system 274 may a processor and/or suitable processing device structured to obtain the memory bits stored in a selected one of the first OTP memory cell 210, the second OTP memory cell 212, the third OTP memory cell 214, or the fourth OTP memory cell 216.

Figure 3:
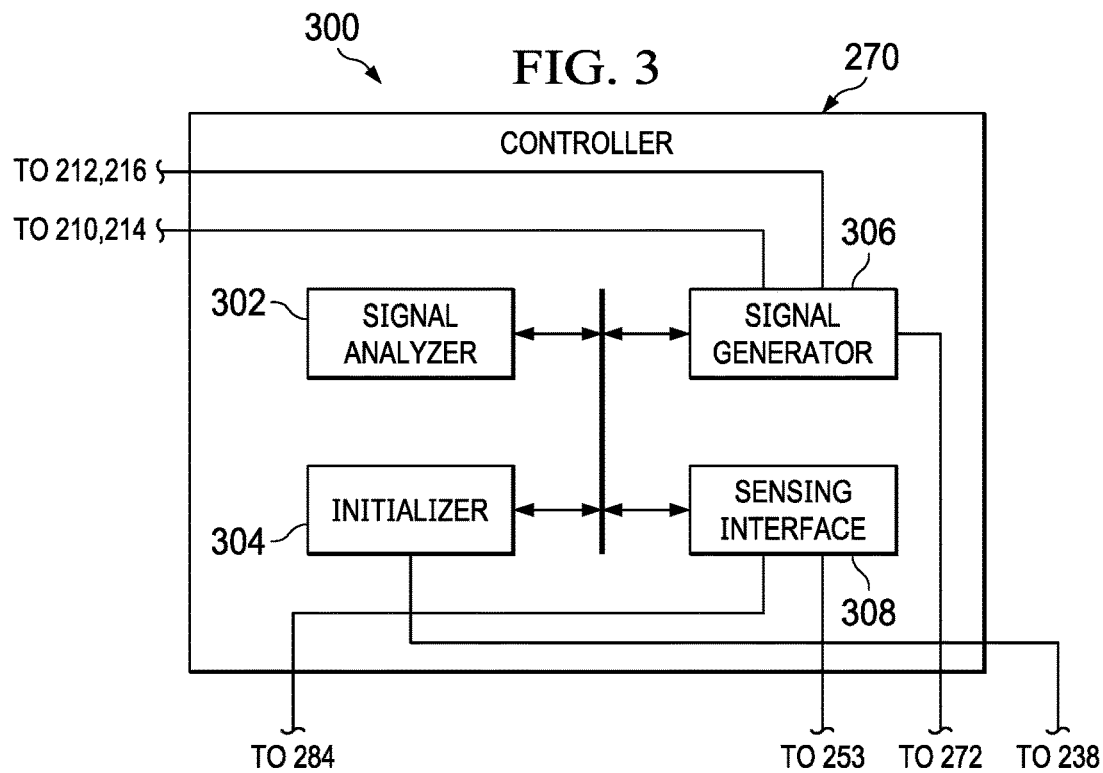
FIG. 3 is a block diagram illustrating the example controller of FIG. 2.

FIG. 3 is a block diagram 300 illustrating the example controller 270 of FIG. 2. The controller 270 of FIG. 3 includes an example signal analyzer 302, an example initializer 304, an example signal generator 306, and an example sensing interface 308. In examples disclosed herein, any of the signal analyzer 302, the initializer 304, the signal generator 306, and/or the sensing interface 308 may communicate via any suitable method of wired and/or wireless communication to respective devices internal to the controller 270 and/or external to the controller 270.

In the example illustrated in FIG. 3, the signal analyzer 302 is configured to determine whether an indication to sense and/or read memory bits is obtained and/or otherwise received. In FIG. 3, the signal analyzer 302 operates in the controller 270 based on pre-initialized commands that indicate to sense and/or otherwise read memory bits. For example, during boot-up of the controller 270, the signal analyzer 302 may respond to a pre-initialized command that indicates to sense and/or otherwise read a memory bit stored in the non-volatile memory (e.g., the first OTP memory cell 210, the second OTP memory cell 212, the third OTP memory cell 214, or the fourth OTP memory cell 216). In other examples disclosed herein, the signal analyzer 302 may be configured to determine whether an indication to sense and/or read memory bits is obtained based on communication with a user interface and/or any suitable input apparatus. In response to the indication to sense and/or read memory bits, the signal analyzer 302 analyzes the indication to determine which of the first OTP memory cell 210, the second OTP memory cell 212, the third OTP memory cell 214, or the fourth OTP memory cell 216 are to be accessed for sensing and/or reading. In examples disclosed herein, the signal analyzer 302 may be a signal analyzer controller.

In the example illustrated in FIG. 3, the initializer 304 is configured to determine whether the sensing circuit 208 of FIG. 2 is initialized. For example, the initializer 304 determines whether the input terminal 286 of the logic gate 236 is initialized to a logic low value. If the initializer 304 determines the sensing circuit 208 of FIG. 2 is not initialized, then the initializer 304 generates the enable signal (line 215) of FIG. 2 for use by the initializing switch 238 of FIG. 2. If the initializer determines the sensing circuit 208 of FIG. 2 is initialized, then the initializer 304 ensures the enable signal (line 215) is off and/or indicates to not conduct the initializing switch 238 of FIG. 2. In examples disclosed herein, the initializer 304 may be an initializer controller.

In the example illustrated in FIG. 3, the signal generator 306 is configured to obtain the indication and/or determination from the signal analyzer 302 to generate corresponding logic values on the signals associated with the word line for the selected memory cell to be read. For example, the signal generator may generate the example word lines (e.g., the first word line (line 205) and the second word line (line 207) to store a memory bit in any of the first OTP memory cell 210, the second OTP memory cell 212, the third OTP memory cell 214, and/or the fourth OTP memory cell 216, respectively. In addition, the signal generator 306 may generate the example reference signal (line 217) of FIG. 2 for use by the reference current generator 272 of FIG. 2. In examples disclosed herein, the signal generator 306 may be a signal generator controller.

In the example illustrated in FIG. 3, the sensing interface 308 is configured to generate the example control signal (line 213) of FIG. 2 for use by the voltage boost circuit 253 of FIG. 2. In addition, the sensing interface 308 is configured to generate the example decode signal (line 231) of FIG. 2 for use by the decoder 284 of FIG. 2. In examples disclosed herein, the sensing interface 308 is configured to generate the control signal (line 213) and the decode signal (line 231) to cause the voltage boost circuit 253 to generate the boosted control signal (line 219a) and/or the complimented boosted control signal (line 219*b*). In examples disclosed herein, the sensing interface 308 may be a sensing interface controller.

In some examples disclosed herein, the initializer 304, the signal generator 306, and/or the sensing interface 308 may be included in a memory controller. Alternatively, in other examples disclosed herein, the controller 270 may include the sensing circuit 208 (e.g., the current mirror 218, the first switch 220, the second switch 228, the logic gate 236, the initializing switch 238, and the reference switch 246), the voltage boost circuit 253, the reference current generator 272, and/or the decoder 284 of FIG. 2.

Figure 4:
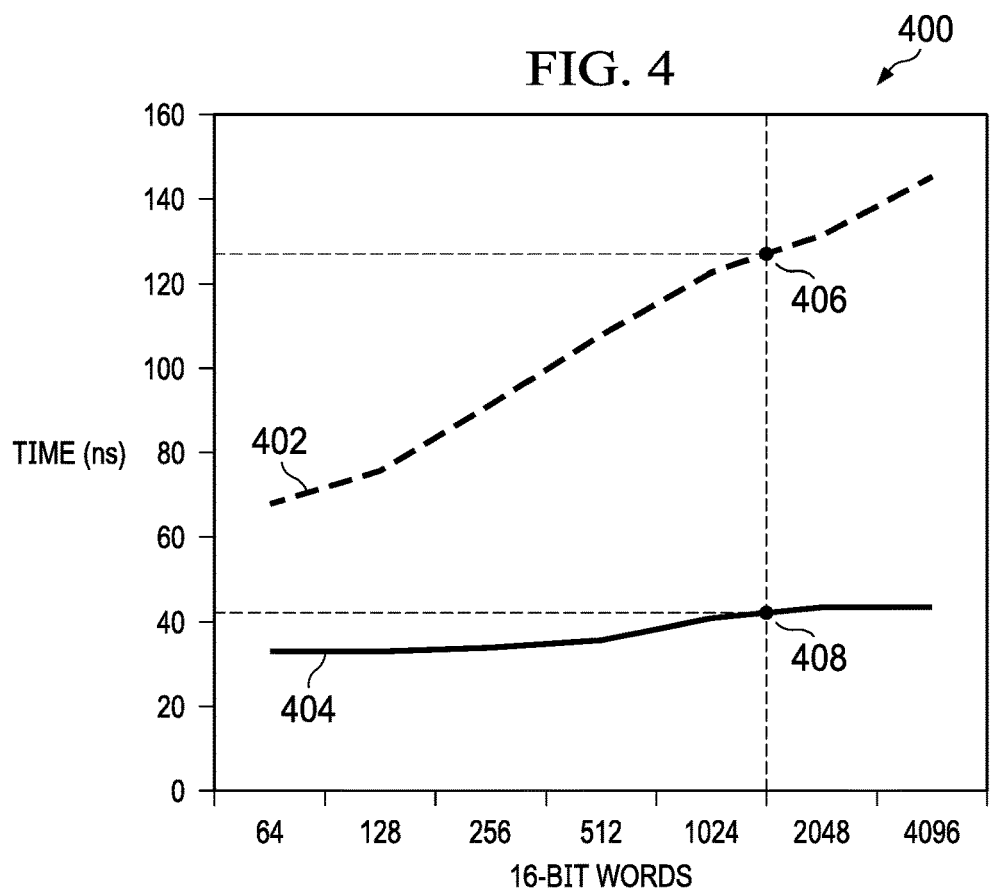
FIG. 4 is a graphical illustration depicting an example cycle time measured with and without the use of the sensing circuit of FIG. 2.

FIG. 4 is a graphical illustration 400 depicting an example cycle time measured with and without the use of the sensing circuit 208 of FIG. 2. As used herein, cycle time represents the time between one access of an OTP memory array and a succeeding access to an OTP memory array. The graphical illustration 400 of FIG. 4 includes an example first data segment (line 402) and an example second data segment (line 404). The first data segment (line 402) represents a trend in cycle time, measured in time (e.g., nanoseconds), versus words when the sensing circuit 208 of FIG. 2 is not utilized (e.g., based on the sensing circuit 108 of FIG. 1). The second data segment (line 404) represents a trend in cycle time, measured in time (e.g., nanoseconds), versus words when the sensing circuit 208 of FIG. 2 is utilized.

Illustrated in the graphical illustration 400 of FIG. 4, at an example first data point 406, the cycle time when accessing 1024 16-bit words is 125 nanoseconds. Moreover, at an example second data point 408, the cycle time when accessing 1024 16-bit words is 42 nanoseconds. Clearly illustrated in FIG. 4, the cycle time of a sensing circuit when utilizing the sensing circuit 208 of FIG. 2 is improved (e.g., a cycle time of 42 nanoseconds versus 125 nanoseconds when accessing 1024 16-bit words).

Figure 5:
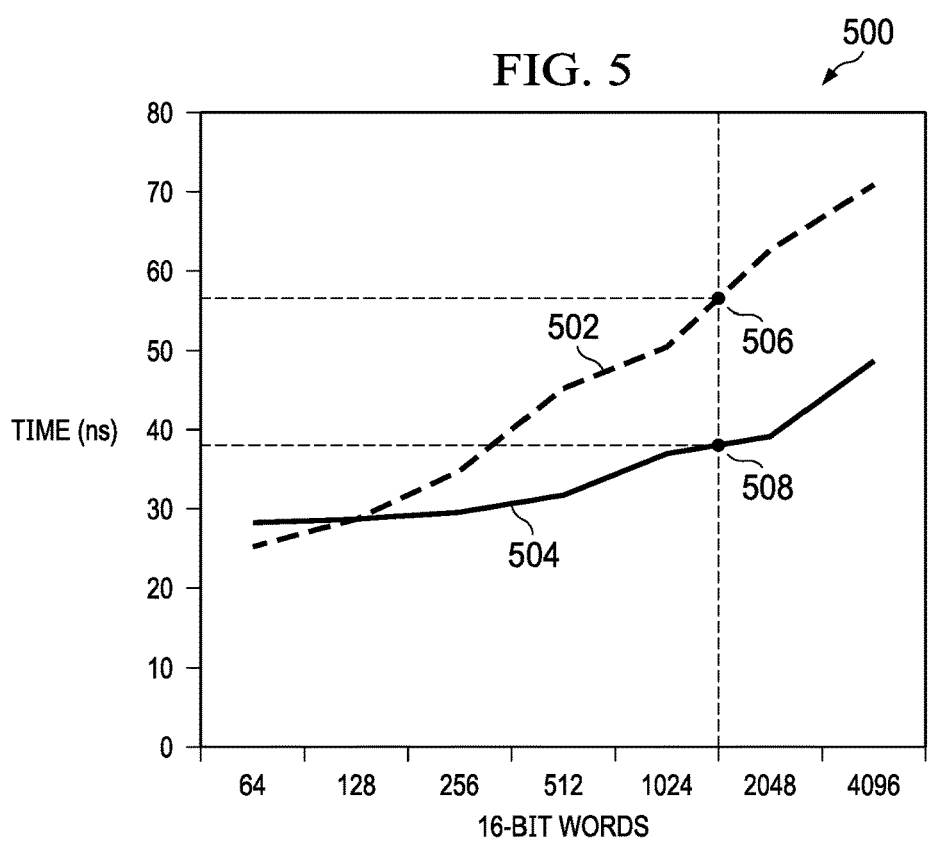
FIG. 5 is a graphical illustration depicting an example access time measured with and without the use of the sensing circuit of FIG. 2.

FIG. 5 is a graphical illustration 500 depicting an example access time measured with and without the use of the sensing circuit 208 of FIG. 2. As used herein, access time represents the time it takes to read and/or sense data, instructions, and information stored in an OTP memory array. The graphical illustration 500 of FIG. 5 includes an example first data segment (line 502) and an example second data segment (line 504). The first data segment (line 502) represents a trend in access time, measured in time (e.g., nanoseconds), versus words when the sensing circuit 208 of FIG. 2 is not utilized (e.g., based on the sensing circuit 108 of FIG. 1). The second data segment (line 504) represents a trend in access time, measured in time (e.g., nanoseconds), versus words when the sensing circuit 208 of FIG. 2 is utilized.

Illustrated in the graphical illustration 500 of FIG. 5, at an example first data point 506, the access time when accessing 1024 16-bit words is 58 nanoseconds. Moreover, at an example second data point 508, the access time when accessing 1024 16-bit words is 38 nanoseconds. Clearly illustrated in FIG. 4, the access time of a sensing circuit when utilizing the sensing circuit 208 of FIG. 2 is improved (e.g., an access time of 38 nanoseconds versus 58 nanoseconds when accessing 1024 16-bit words).

Figure 6:
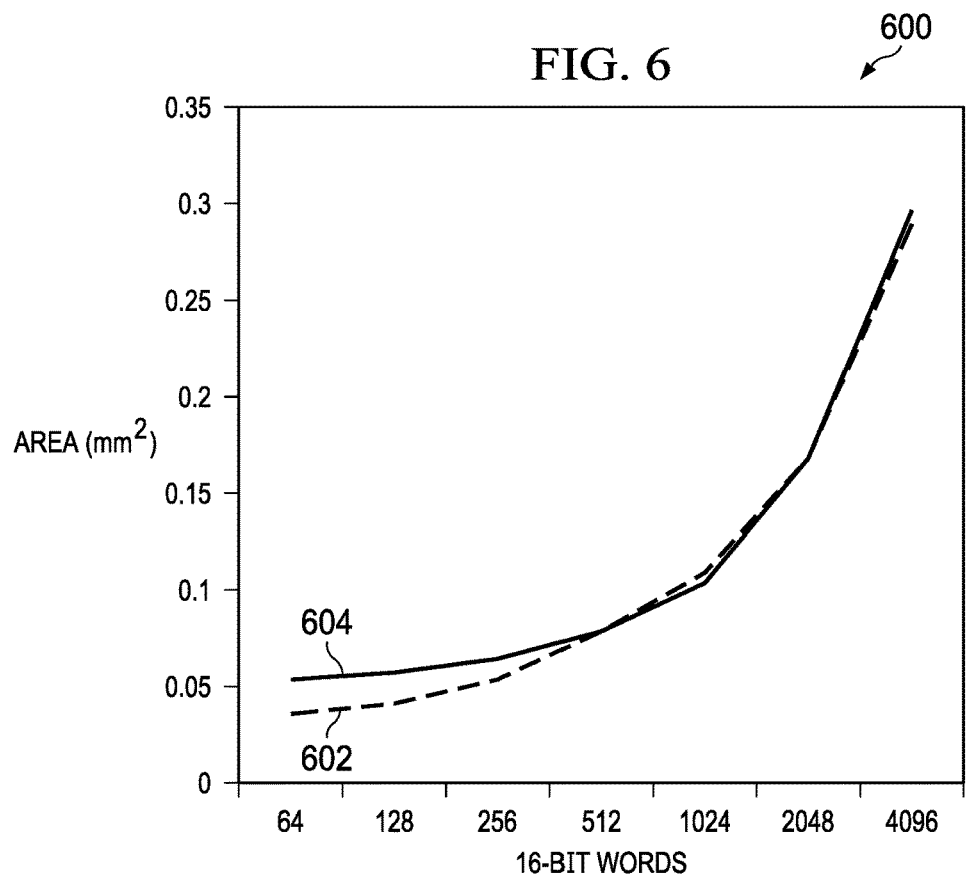
FIG. 6 is a graphical illustration depicting an example area measured with and without the sensing circuit of FIG. 2.

FIG. 6 is a graphical illustration 600 depicting an example area measured with and without the sensing circuit 208 of FIG. 2. As used herein, area represents the physical size, measured in millimeters squared, of the corresponding sensing circuit. The graphical illustration 600 of FIG. 6 includes an example first data segment (line 602) and an example second data segment (line 604). The first data segment (line 602) represents a trend in area for varying 16-bit word levels when the sensing circuit 208 of FIG. 2 is not utilized (e.g., based on the sensing circuit 108 of FIG. 1). The second data segment (line 404) represents a trend in area for varying 16-bit word levels when the sensing circuit 208 of FIG. 2 is utilized.

Illustrated in the graphical illustration 600 of FIG. 6, the area, or physical size, of the sensing circuit 208 is not significantly increased as compared to the area, or physical size of the sensing circuit 108 of FIG. 1.

Figure 7:
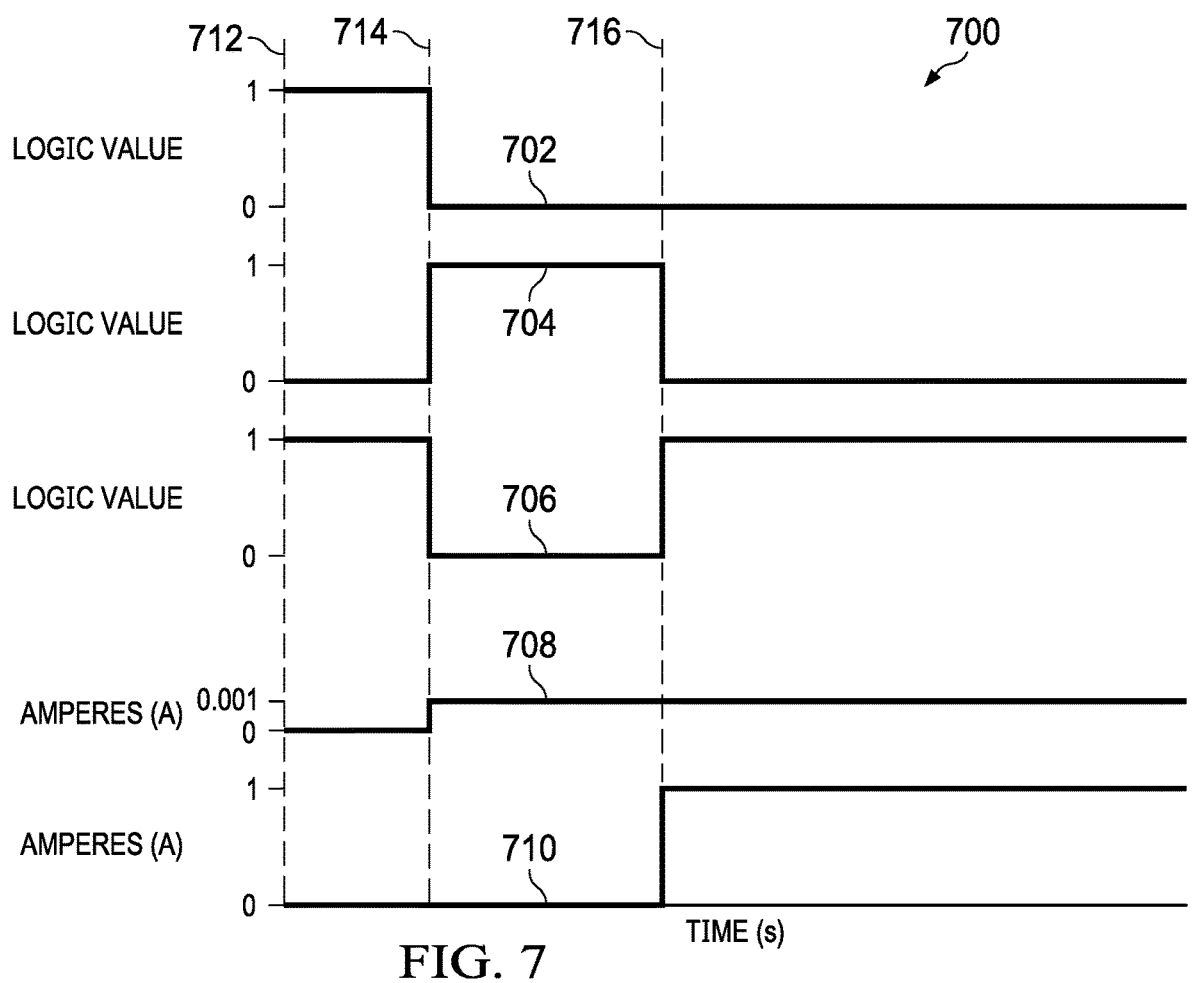
FIG. 7 is a signal plot depicting various signals occurring in the sensing circuit of FIG. 2.

FIG. 7 is a signal plot 700 depicting various signals occurring in the sensing circuit 208 of FIG. 2. The signal plot 700 of FIG. 7 includes an example initializing signal (line 702), an example input signal (line 704), an example output signal (line 706), an example reference current signal (line 708), and an example bit current signal (line 710). In FIG. 7, the initializing signal (line 702) may represent the enable signal (line 215) of FIG. 2, the input signal (line 704) may represent the signal at the input terminal 286 of the logic gate 236, the output signal (line 706) may represent the signal at the output terminal 288 of the logic gate 236, the reference current signal (line 708) may represent the reference current ($I_{REF}$) of FIG. 2, and the bit current signal (line 710) may represent the bit current ($I_{BIT}$) of FIG. 2. In the signal plot 700 of FIG. 7, the magnitude of any of the signals may be any suitable value.

Between an example first time interval 712 and an example second time interval 714, the initializing signal (line 702) is a logic high value, the input signal (line 704) is a logic low value, the output signal (line 706) is a logic high value, the reference current signal (line 708) is zero amperes, and the bit current signal (line 710) is zero amperes. At the second time interval 714, the reference current signal (line 708) is generated and the initializing signal (line 702) is a logic low (e.g., turned off). Therefore, between the second time interval 714 and an example third time interval 716, the initializing signal (line 702) is a logic low value, the input signal (line 704) is a logic high value, the output signal (line 706) is a logic low value, the reference current signal (line 708) is 1 milliamperes, and the bit current signal (line 710) is zero amperes At the third time interval 716, a memory bit is sensed and/or otherwise read and, thus, the bit current becomes one ampere. Therefore, at the third time interval 716, the initializing signal (line 702) is a logic low value, the input signal (line 704) is a logic low value, the output signal (line 706) is a logic high value, the reference current signal (line 708) is 1 milliamperes, and the bit current signal (line 710) is one ampere.

While an example manner of implementing the sensing circuit 208 and/or the controller 270 of FIG. 2 is illustrated in FIGS. 2 and 3, one or more of the elements, processes and/or devices illustrated in FIGS. 2 and 3 may be combined, divided, re-arranged, omitted, eliminated and/or implemented in any other way. Further, the example first switch 220, the example second switch 228, the example logic gate 236, the example initializing switch 238, the example reference switch 246, and/or, more generally, the example sensing circuit 208 of FIG. 2, the example signal analyzer 302, the example initializer 304, the example signal generator 306, the example sensing interface 308, and/or, more generally, the example controller 270 of FIGS. 2 and 3 may be implemented by hardware, software, firmware and/or any combination of hardware, software and/or firmware. Thus, for example, any of example first switch 220, the example second switch 228, the example logic gate 236, the example initializing switch 238, the example reference switch 246, and/or, more generally, the example sensing circuit 208 of FIG. 2, the example signal analyzer 302, the example initializer 304, the example signal generator 306, the example sensing interface 308, and/or, more generally, the example controller 270 of FIGS. 2 and 3 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example first switch 220, the example second switch 228, the example logic gate 236, the example initializing switch 238, the example reference switch 246, and/or, more generally, the example sensing circuit 208 of FIG. 2, the example signal analyzer 302, the example initializer 304, the example signal generator 306, the example sensing interface 308, and/or, more generally, the example controller 270 of FIGS. 2 and 3 is/are hereby expressly defined to include a non-transitory computer readable storage device or storage disk such as a memory, a digital versatile disk (DVD), a compact disk (CD), a Blu-ray disk, etc. including the software and/or firmware. Further still, the example sensing circuit 208 of FIG. 2 and/or the example controller 270 of FIGS. 2 and 3 may include one or more elements, processes and/or devices in addition to, or instead of, those illustrated in FIGS. 2 and 3, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 8:
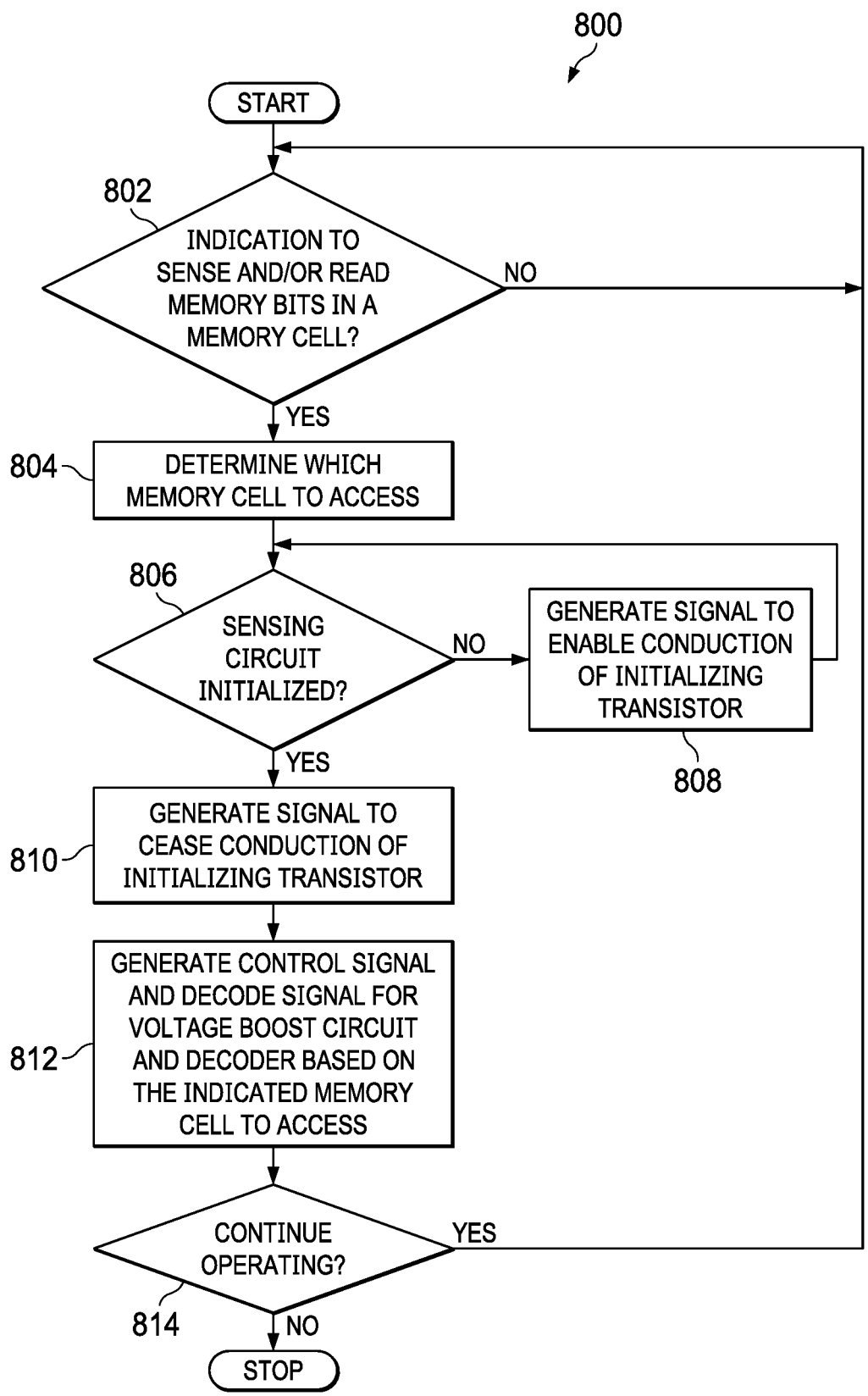
FIG. 8 is a flowchart representative of a process that may be implemented using logic or machine readable instructions that may be executed to implement the controller of FIG. 2.
Figure 9:
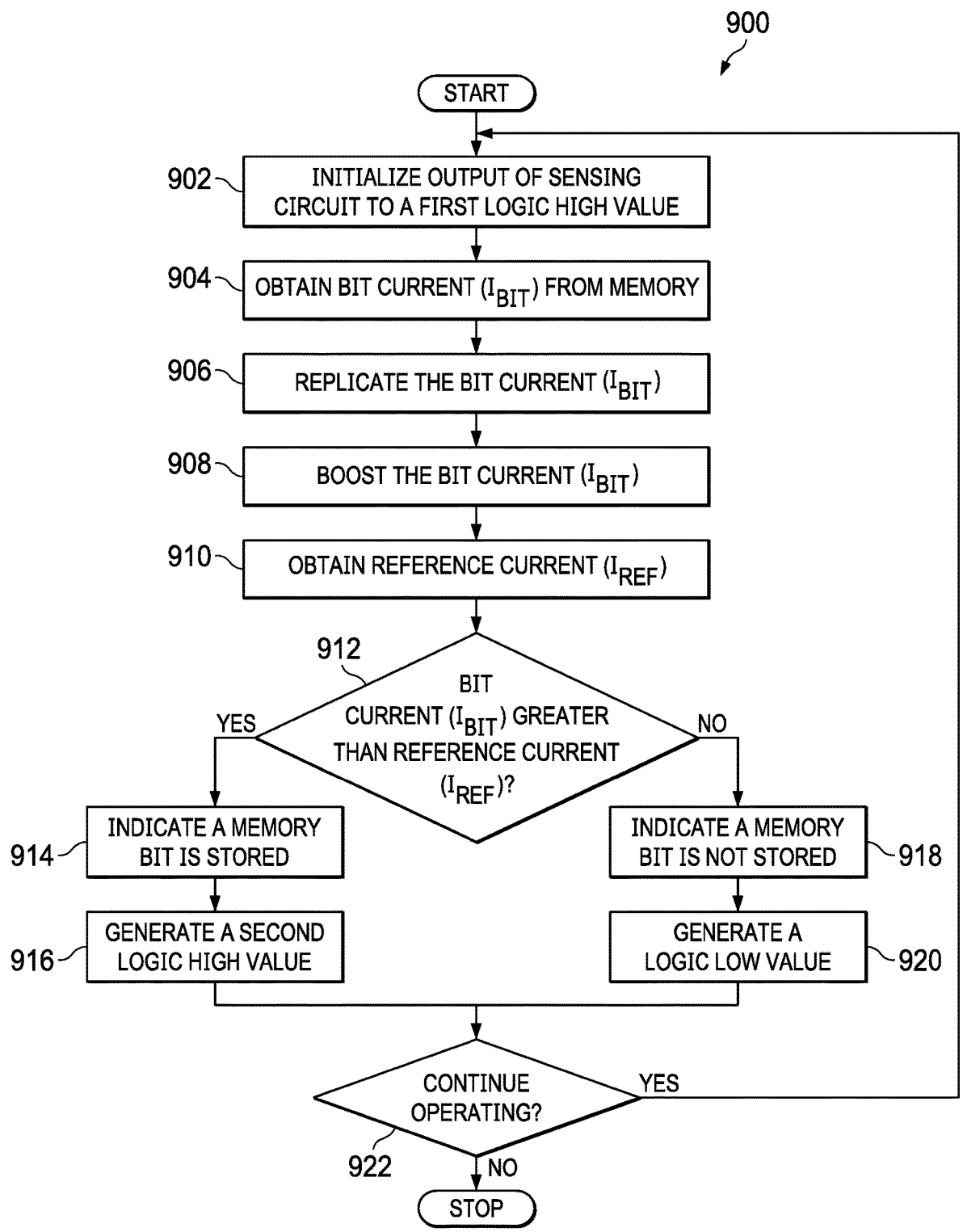
FIG. 9 is a flowchart representative of a process that may be implemented using logic or machine readable instructions that may be executed to implement the sensing circuit of FIG. 2.
Figure 13:
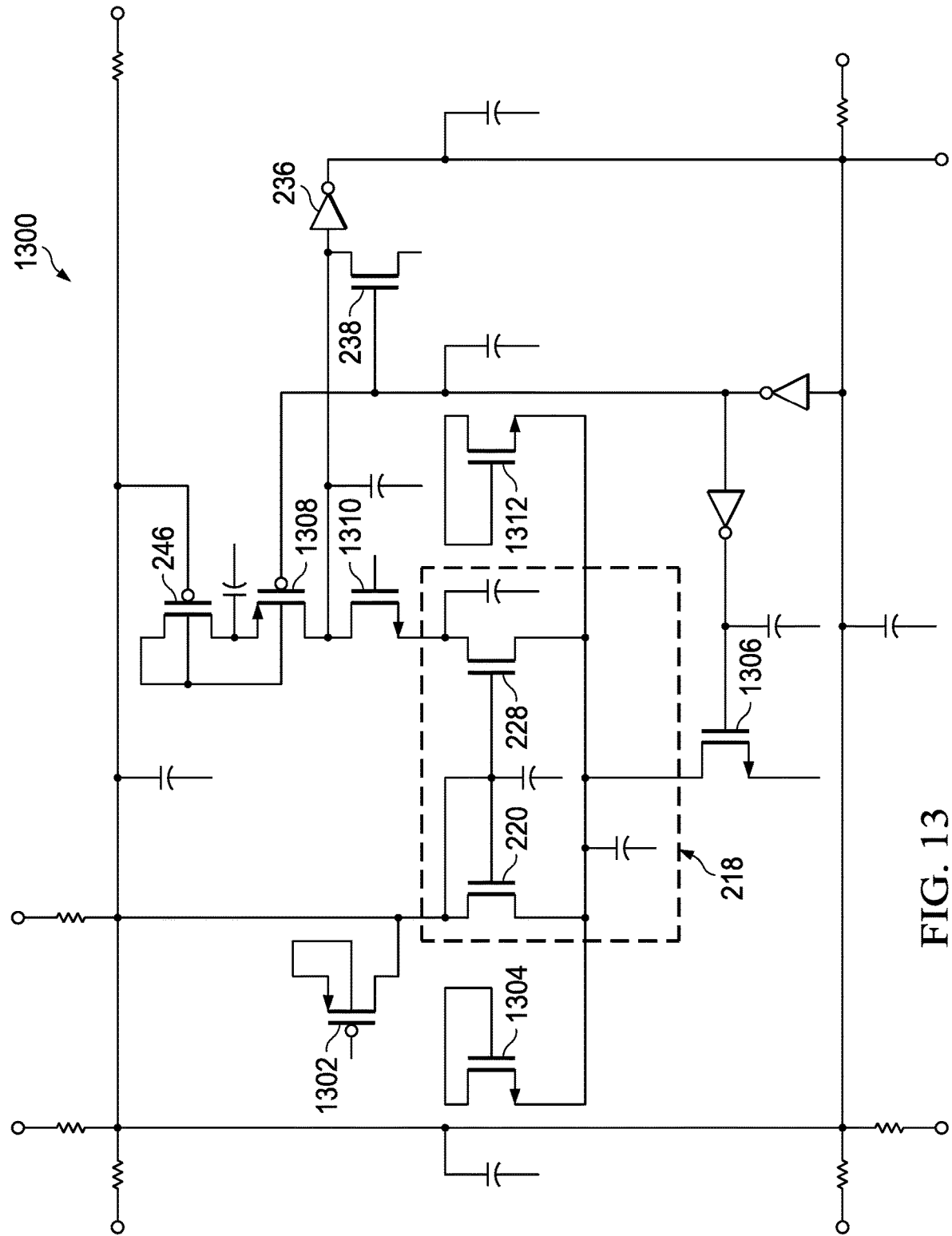
FIG. 13 illustrates another example implementation of the schematic illustration of FIG. 2 including additional logic circuitry.

Flowcharts representative of example hardware logic, machine readable instructions, hardware implemented state machines, and/or any combination thereof for implementing the example sensing circuit 208 of FIG. 2 and/or the example controller 270 of FIGS. 2 and 3 are shown in FIGS. 8 and 9. Furthermore, the flowcharts representative of example hardware logic, machine readable instructions, hardware implemented state machines, and/or any combination thereof for implementing the example system 1000 of FIG. 10 and/or the system 1300 of FIG. 13 are shown in FIGS. 8 and 9. The machine readable instructions may be one or more executable programs or portion(s) of an executable program for execution by a computer processor such as the processor 1412 shown in the example processor platform 1400 discussed below in connection with FIG. 14. The program may be embodied in software stored on a non-transitory computer readable storage medium such as a CD-ROM, a floppy disk, a hard drive, a DVD, a Blu-ray disk, or a memory associated with the processor 1412, but the entire program and/or parts thereof could alternatively be executed by a device other than the processor 1412 and/or embodied in firmware or dedicated hardware. Further, although the example program is described with reference to the flowcharts illustrated in FIGS. 8 and 9, many other methods of implementing the example sensing circuit 208 of FIG. 2, the example controller 270 of FIGS. 2 and 3, the system 1000 of FIG. 10, and/or the system 1300 of FIG. 13 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein. In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 8 and 9 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 8 is a flowchart representative of a process 800 that may be implemented using logic or machine readable instructions that may be executed to implement the controller 270 of FIG. 2. In the example illustrated in FIG. 8, the signal analyzer 302 of FIG. 3 determines whether an indication to sense and/or read memory bits is obtained and/or otherwise received (block 802). If the control of block 802 returns a NO (e.g., if an indication to sense and/or read memory bits is not obtained or received), then control proceeds to block 802 and waits. Alternatively, if the control of block 802 returns a YES (e.g., if an indication to sense and/or read memory bits is obtained or received by the signal analyzer 302), then the signal analyzer 302 determines, based on the received indication, which memory cells (e.g., the first OTP memory cell 210, the second OTP memory cell 212, the third OTP memory cell 214, and/or the fourth OTP memory cell 216) are to be accessed (block 804).

In response to the execution of the control of block 804, the initializer 304 determines whether the sensing circuit 208 of FIG. 2 is initialized (block 806). If the control of block 806 returns NO, then the initializer 304 generates an enable signal (e.g., the enable signal (line 215)) to enable conduction of the initializing switch 238 (block 808). Further, in response to the execution of the control of block 808, control proceeds back to 806 in which the initializer 304 determines whether the sensing circuit 208 of FIG. 2 is initialized.

Alternatively, if the control of block 806 returns YES, then the initializer 304 generates a signal (e.g., the enable signal (line 215)) to cease conduction of the initializing switch 238 (block 810). In another example, the initializer 304 may not generate a signal (e.g., the enable signal (line 215)) to cease conduction of the initializing switch 238 and, alternatively, cease generation of the previously generated enable signal of block 808.

In response to the execution of the control of block 810, the sensing interface 308 generates an enable signal (e.g., the control signal (line 213)) for the voltage boost circuit 253 and the decode signal (line 231) for the decoder 284 (block 812). In response, the controller 270 of FIGS. 2 and 3 determine whether to continue operating (block 814). If the control of block 814 returns YES (e.g., the controller 270 determines to continue operating), then control returns to block 802. Alternatively, if the control of block 814 returns NO (e.g., the controller 270 determines not to continue operating), then the process stops.

FIG. 9 is a flowchart representative of a process 900 that may be implemented using logic or machine readable instructions that may be executed to implement the sensing circuit 208 of FIG. 2. In FIG. 9, the sensing circuit 208 initializes the output terminal 288 of the logic gate 236 to be a first logic high value (block 902). In response, the current mirror 218 of FIG. 2 obtains (e.g., conducts) the bit current ($I_{BIT}$) (block 904). Further, the current mirror 218 replicates the bit current ($I_{BIT}$) (block 906). Further, the current mirror 218 boosts the bit current ($I_{BIT}$) (block 908). In addition, the reference switch 246 obtains (e.g., conducts) the reference current ($I_{REF}$) (block 910). In response, the logic gate 236 determines whether the bit current ($I_{BIT}$) (e.g., the replicated bit current ($I_{BIT}$)) is greater than the reference current ($I_{REF}$) (block 912).

In response to the control of block 912 returning YES (e.g., the bit current ($I_{BIT}$) is greater than the reference current ($I_{REF}$)), then the logic gate 236 indicates a memory bit is stored (block 914). Further, the logic gate 236 generates a second logic high value at the output terminal 288 (block 916).

Alternatively, in response to the control of block 912 returning NO (e.g., the bit current ($I_{BIT}$) is less than or equal to the reference current ($I_{REF}$)), then the logic gate 236 indicates a memory bit is not stored (block 918). Further, the logic gate 236 generates a logic low value at the output terminal 288 (block 920). In response to the execution of the control illustrated in blocks 916 or 920, some examples disclosed herein include transmitting the logic value to a computing system (e.g., the computing system 274 of FIG. 2). In response to the execution of the control of block 916 or 920, the sensing circuit 208 determines whether to continue operating (block 922). If the sensing circuit 208 determines to continue operating (e.g., the execution of block 922 returns YES), then control returns to block 902. Alternatively, in response to the sensing circuit 208 determining not to continue operating (e.g., the execution of block 922 returns NO), then the process stops.

Figure 10:
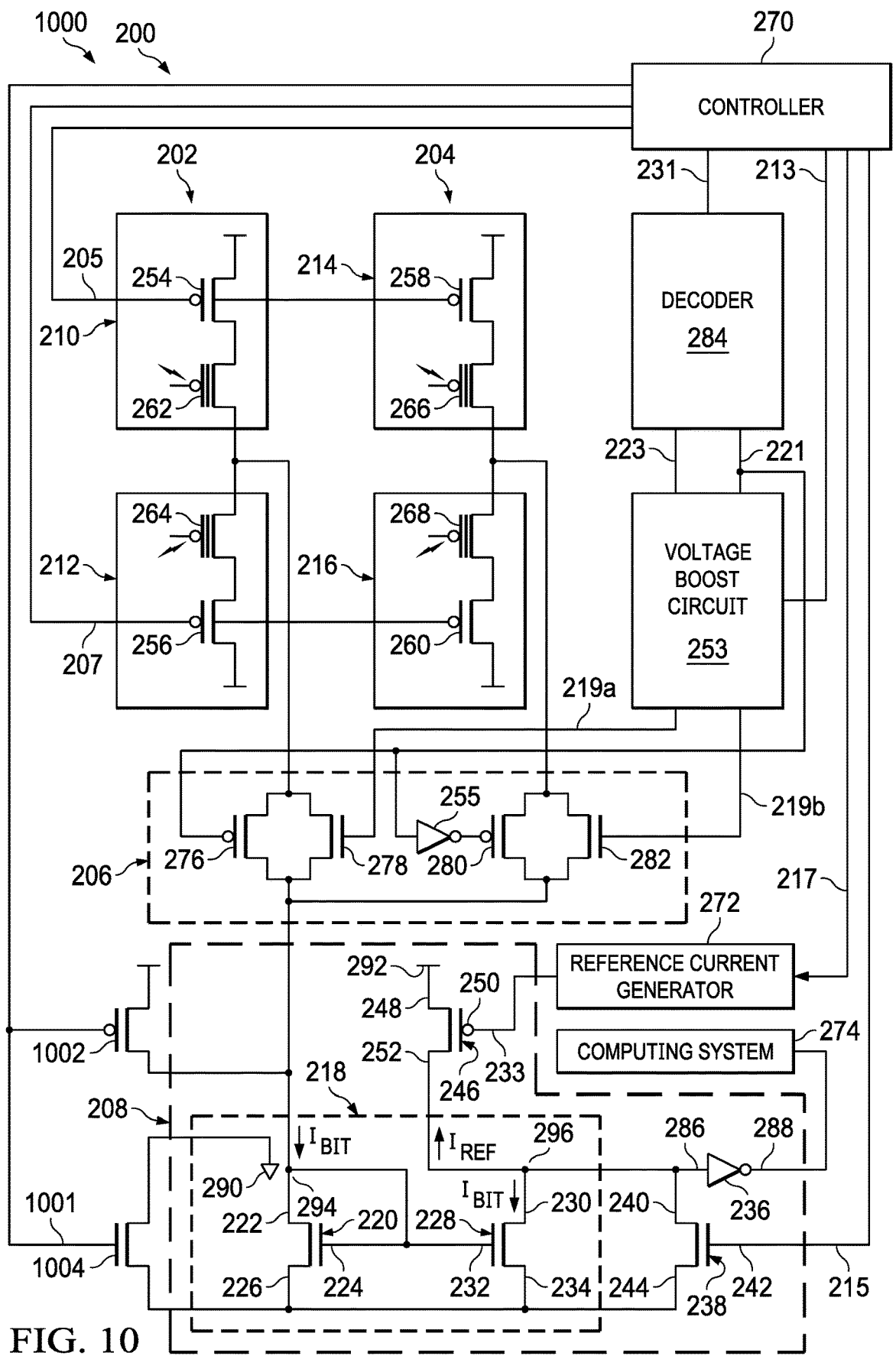
FIG. 10 illustrates the schematic illustration of FIG. 2 including additional logic circuitry.

FIG. 10 illustrates the schematic illustration 200 of FIG. 2 including additional logic circuitry. The example system 1000 of FIG. 10 further includes an example first transistor 1002 and an example second transistor 1004. The first transistor 1002 is a PMOS transistor. The second transistor 1004 is an NMOS transistor. In operation, the first transistor 1002 and the second transistor 1004 obtain an example power-up signal (line 1001) from the controller 270. The first transistor 1002 and/or the second transistor 1004 enable improved control of the sensing circuit 208. For example, when a read operation is not desired, the power-up signal (line 1001) becomes a logic low and, as such, causes the second transistor 1004 to not conduct. In this example, power is conserved because the path to the example ground rail 290 is open. In other examples disclosed herein, any suitable number of logic circuit and/or devices may be utilized to improve control of the sensing circuit 208 to save power, improve performance, etc. While FIG. 2 illustrates the example power-up signal (line 1001) being obtained from the controller 270, such an example power-up signal (line 1001) may be obtained from any suitable device internal or external to the system 1000.

Figure 11:
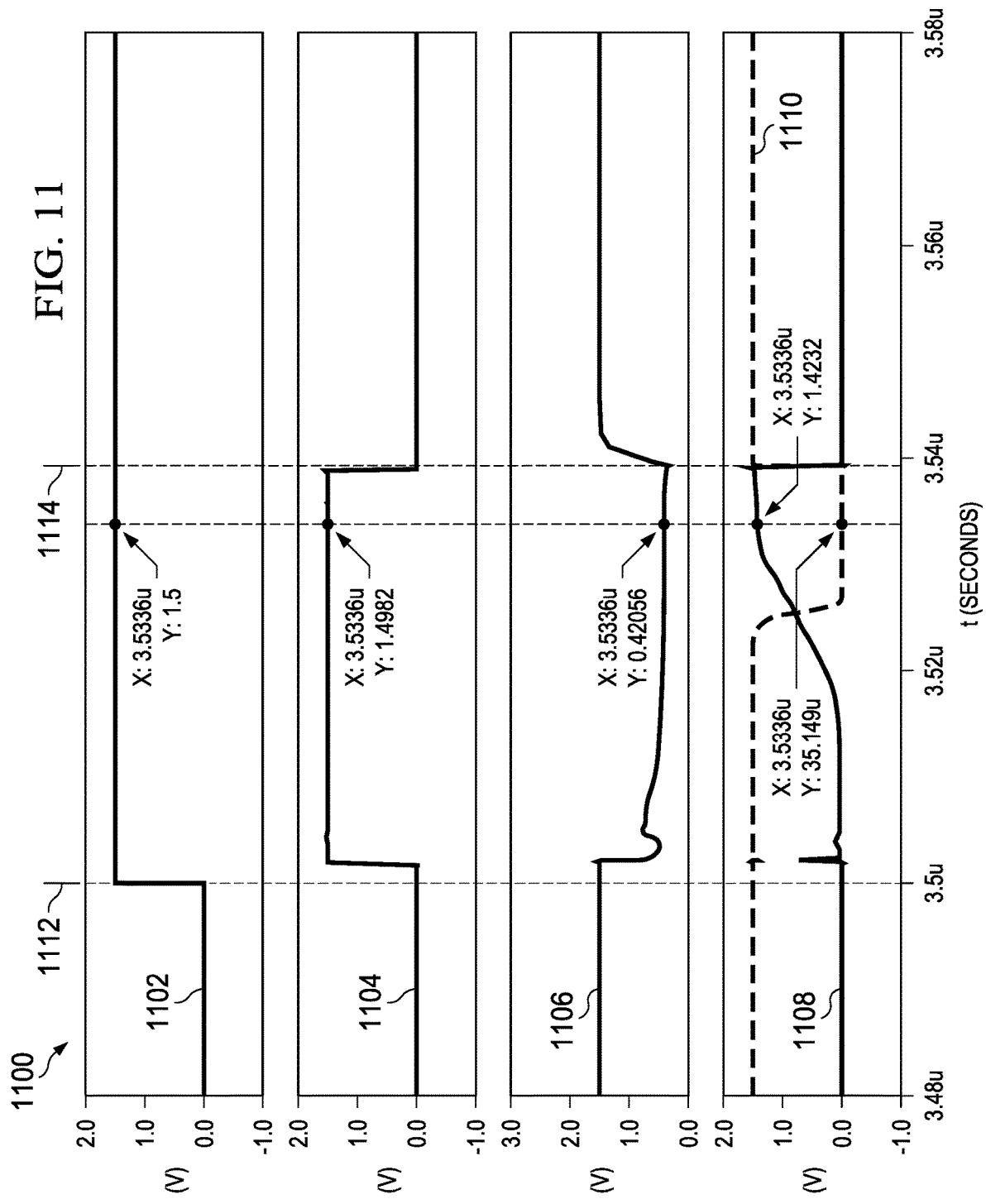
FIG. 11 is a signal plot depicting various voltage signals occurring in the system of FIG. 10 when reading a logic low value.

FIG. 11 is a signal plot 1100 depicting various voltage signals occurring in the system 1000 of FIG. 10 when reading a logic low value. The signal plot 1100 includes an example clock signal (line 1102), an example power-up signal (line 1104), an example first voltage signal (line 1106), an example second voltage signal (line 1108) and an example third voltage signal (line 1110). The clock signal (line 1102) may be the example decode signal (line 231) of FIGS. 2 and/or 10, the power-up signal (line 1104) may be the example power-up signal (line 1001) of FIG. 10, the example first voltage signal (line 1106) may correspond to the voltage at the first terminal 294 of the current mirror 218 of the sensing circuit 208 (e.g., the first drain terminal 222 of the first switch 220) of FIGS. 2 and/or 10, the example second voltage signal (line 1108) may correspond to the voltage at the input terminal 286 of the logic gate 236 of FIGS. 2 and/or 10, and the example third voltage signal (line 1110) may correspond to the voltage at the output terminal 288 of the logic gate 236 of FIGS. 2 and/or 10.

At an example first time 1112, the clock signal (line 1102) becomes a logic high. After a slight delay, the power-up signal (line 1104) becomes a logic high, thereby causing the first voltage signal (line 1106) to decrease. However, between the first time 1112 and an example second time 1114, the second voltage signal (line 1108) begins to increase. For example, when reading a logic low value, the reference current ($I_{REF}$) is greater than the bit current ($I_{BIT}$) and, thus, the second voltage signal (line 1108) increases to a voltage equivalent to, or substantially similar to, the example power rail 292 (FIGS. 2 and/or 10). As a result, the third voltage is signal (line 1110) decreases.

Figure 12:
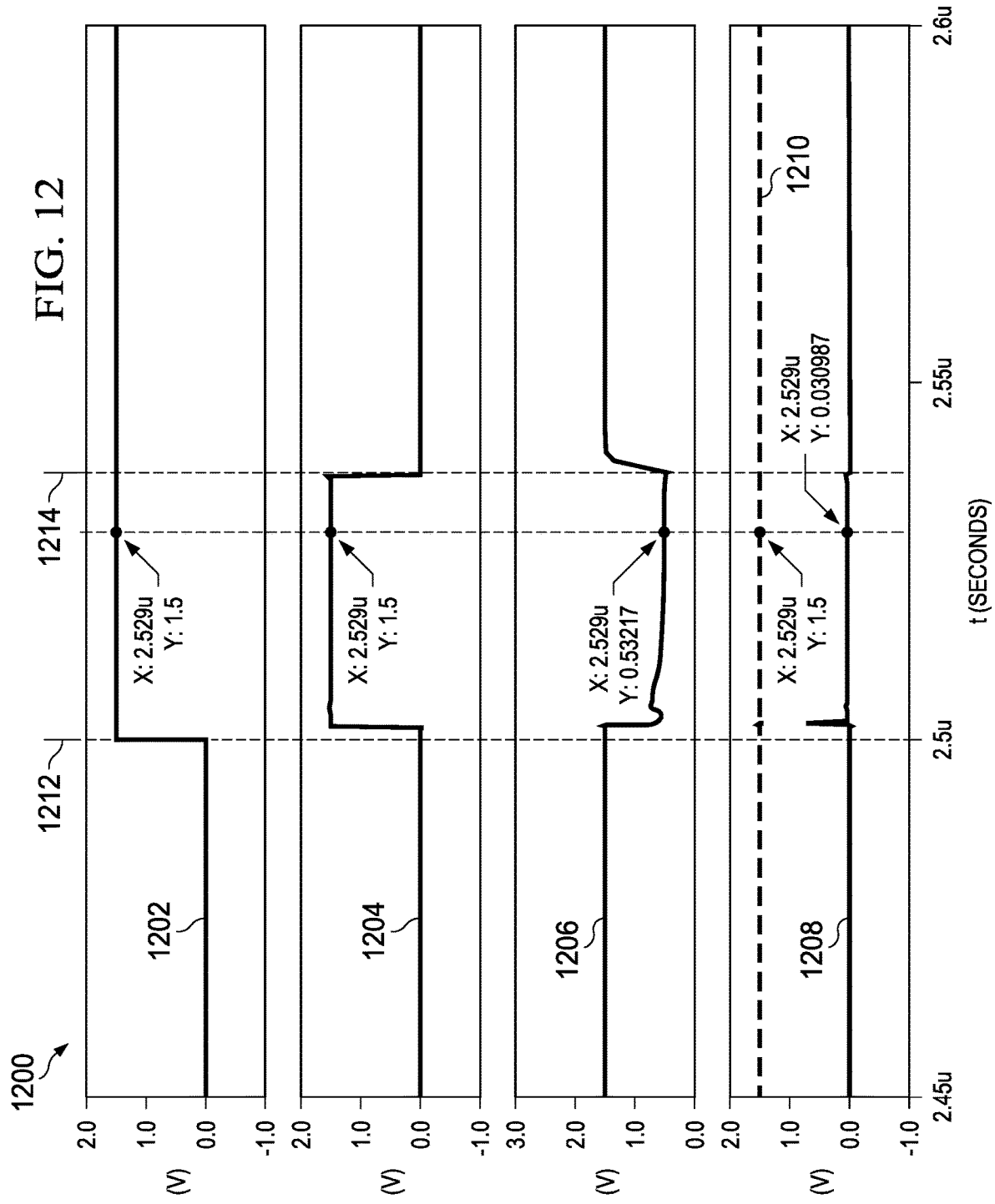
FIG. 12 is a signal plot depicting various voltage signals occurring in the system of FIG. 10 when reading a logic high value.

FIG. 12 is a signal plot 1200 depicting various voltage signals occurring in the system 1000 of FIG. 10 when reading a logic high value. The signal plot 1200 includes an example clock signal (line 1202), an example power-up signal (line 1204), an example first voltage signal (line 1206), an example second voltage signal (line 1208) and an example third voltage signal (line 1210). The clock signal (line 1202) may be the example decode signal (line 231) of FIGS. 2 and/or 10, the power-up signal (line 1204) may be the example power-up signal (line 1001) of FIG. 10, the example first voltage signal (line 1206) may correspond to the voltage at the first drain terminal 222 of the first switch 220 of FIGS. 2 and/or 10, the example second voltage signal (line 1128) may correspond to the voltage at the input terminal 286 of the logic gate 236 of FIGS. 2 and/or 10, and the example third voltage signal (line 1210) may correspond to the voltage at the output terminal 288 of the logic gate 236 of FIGS. 2 and/or 10.

At an example first time 1212, the clock signal (line 1202) becomes a logic high. After a slight delay, the power-up signal (line 1204) becomes a logic high, thereby causing the first voltage signal (line 1206) to decrease. However, between the first time 1212 and an example second time 1214, the second voltage signal (line 1208) remains substantially constant. For example, when reading a logic high value, the reference current ($I_{REF}$) is not greater than the bit current ($I_{BIT}$) and, thus, the second voltage signal (line 1108) is a voltage equivalent to, or substantially similar to, the example ground rail 290 (FIGS. 2 and/or 10). As a result, the third voltage is signal (line 1110) remains a logic high.

FIG. 13 illustrates another example implementation of the schematic illustration 200 of FIG. 2 including additional logic circuitry. The system 1300 of FIG. 13 includes the example current mirror 218 (FIGS. 2 and/or 10) including the example first switch 220 (FIGS. 2 and/or 10) and the example second switch 228 (FIGS. 2 and/or 10), the example logic gate 236 (FIGS. 2 and/or 10), the example initializing switch 238 (FIGS. 2 and/or 10) and the example reference switch 246 (FIGS. 2 and/or 10). In addition, the system 1300 of FIG. 13 further includes an example first switch 1302, an example second switch 1304, an example third switch 1306, an example fourth switch 1308, an example fifth switch 1310, and an example sixth switch 1312.

The system 1300, in operation, performs substantially similar functions as sensing circuit 208 of FIGS. 2 and/or 10. However, the first switch 1302 and the sixth switch 1312 may be implemented to improve manufacturability. For example, the first switch 1302 and/or the sixth switch 1312 may be coupled to the first switch 220 and/or the second switch 228, respectively, to reduce mismatch variations during manufacturing. However, the first switch 1302, the second switch 1304, the third switch 1306, the fourth switch 1308, the fifth switch 1310, and/or the sixth switch 1312 are controllable by respective control signals to improve the ability to control the system 1300. For example, the first switch 1302, the second switch 1304, the third switch 1306, the fourth switch 1308, the fifth switch 1310, and/or the sixth switch 1312 may be enables to enable conduction of or disable conduction of current to save power. Further in such an example, the fourth switch 1308 and/or the fifth switch 1310 may be disabled in the interest of blocking a reference current from being generated. In other examples disclosed herein, any number of logic devices and/or logic circuits may be utilized to control operation and conserve power in the system 1300.

Figure 14:
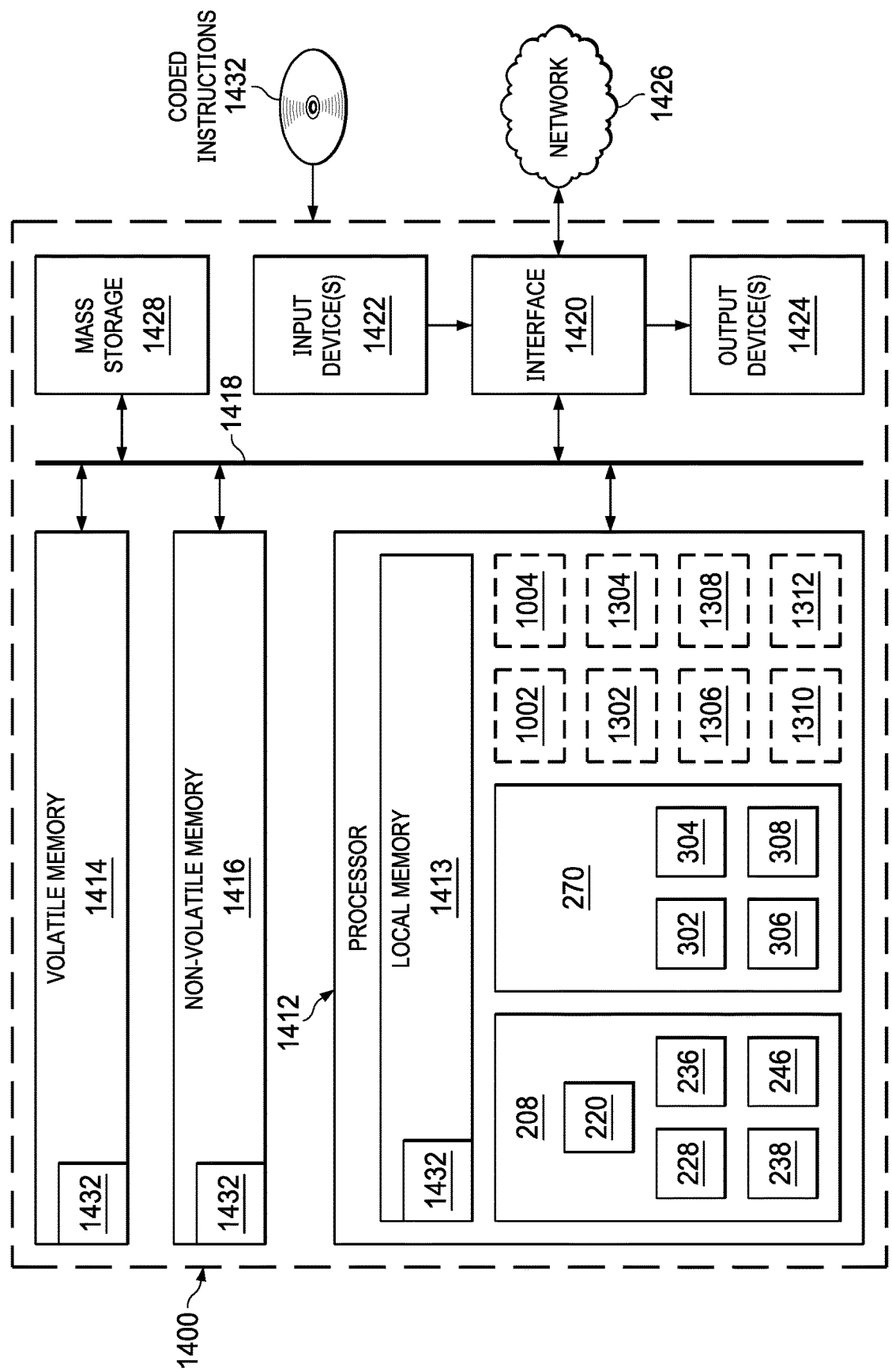
FIG. 14 is a block diagram of an example processing platform structured to execute the instructions of FIGS. 8 and 9 to implement the sensing circuit of FIG. 2 and the controller of FIGS. 2 and 3.

FIG. 14 is a block diagram of an example processing platform structured to execute the instructions of FIGS. 8 and 9 to implement the sensing circuit 208 of FIG. 2, the controller 270 of FIGS. 2 and/or 3, the system 1000 of FIG. 10, and/or the system 1300 of FIG. 13. The processor platform 1400 can be, for example, a server, a personal computer, a workstation, a self-learning machine (e.g., a neural network), a mobile device (e.g., a cell phone, a smart phone, a tablet such as an iPad'), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1400 of the illustrated example includes a processor 1412. The processor 1412 of the illustrated example is hardware. For example, the processor 1412 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example first switch 220, the example second switch 228, the example logic gate 236, the example initializing switch 238, the example reference switch 246, and/or, more generally, the example sensing circuit 208 of FIG. 2, the example signal analyzer 302, the example initializer 304, the example signal generator 306, the example sensing interface 308, and/or, more generally, the example controller 270 of FIGS. 2, and/or 3, the example first switch 220, the example second switch 228, the example logic gate 236, the example initializing switch 238, the example reference switch 246, the example first transistor 1002, the example second transistor 1004, and/or, more generally, the example system 1000 of FIG. 10, the example current mirror 218, the example logic gate 236, the example initializing switch 238, the example reference switch 246, the example first switch 1302, the example second switch 1304, the example third switch 1306, the example fourth switch 1308, the example fifth switch 1310, the example sixth switch 1312, and/or, more generally, the example system 1300 of FIG. 13.

The processor 1412 of the illustrated example includes a local memory 1413 (e.g., a cache). The processor 1412 of the illustrated example is in communication with a main memory including a volatile memory 1414 and a non-volatile memory 1416 via a bus 1418. The volatile memory 1414 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1416 may be implemented by flash memory and/or any other desired type of memory device. Access to the main memory 1414, 1416 is controlled by a memory controller.

The processor platform 1400 of the illustrated example also includes an interface circuit 1420. The interface circuit 1420 may be implemented by any type of interface standard, such as an Ethernet interface, a universal serial bus (USB), a Bluetooth® interface, a near field communication (NFC) interface, and/or a PCI express interface.

In the illustrated example, one or more input devices 1422 are connected to the interface circuit 1420. The input device(s) 1422 permit(s) a user to enter data and/or commands into the processor 1412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1424 are also connected to the interface circuit 1420 of the illustrated example. The output devices 1424 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1420 of the illustrated example, thus, typically includes a graphics driver card, a graphics driver chip and/or a graphics driver processor.

The interface circuit 1420 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1426. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1400 of the illustrated example also includes one or more mass storage devices 1428 for storing software and/or data. Examples of such mass storage devices 1428 include floppy disk drives, hard drive disks, compact disk drives, Blu-ray disk drives, redundant array of independent disks (RAID) systems, and digital versatile disk (DVD) drives.

The machine executable instructions 1432 of FIGS. 8 and 9 may be stored in the mass storage device 1428, in the volatile memory 1414, in the non-volatile memory 1416, and/or on a removable non-transitory computer readable storage medium such as a CD or DVD.

From the foregoing, it will be appreciated that example methods, apparatus and articles of manufacture have been disclosed that improve the efficiency when sensing and/or otherwise reading bit stored in memory. In examples disclosed herein, the access time and the cycle time when sensing and/or otherwise reading bits stored in an OTP memory is improved. As such, in some examples disclosed herein, the improved access time and the cycle time when sensing and/or otherwise reading bits stored in an OTP memory allows for the efficient operation of the OTP memory regardless of whether a shadow volatile memory is utilized. The disclosed methods, apparatus and articles of manufacture improve the efficiency of using a computing device by sensing a memory bit in an OTP memory by replicating the bit current and comparing with a reference current. Furthermore, the sensing circuit is initialized to read a logic high value. By replicating the bit current using a current mirror, the sensing time (e.g., access time and/or cycle time) of the OTP memory is improved. The disclosed methods, apparatus and articles of manufacture are accordingly directed to one or more improvement(s) in the functioning of a computer.

Example methods, apparatus, systems, and articles of manufacture to improve performance while reading a one-time-programmable memory are disclosed herein. Further examples and combinations thereof include the following:

Example 1 includes an apparatus comprising a current mirror including a first terminal and a second terminal, the first terminal configured to be coupled to a memory, a logic gate including an input terminal coupled to the second terminal of the current mirror, a first transistor including a first current terminal and second current terminal, the first current terminal of the first transistor coupled to the input terminal of the logic gate, the second current terminal of the first transistor coupled to a ground rail, and a second transistor including a first current terminal and a second current terminal, the first current terminal of the second transistor configured to be coupled to a power rail, the second current terminal of the second transistor coupled to the input terminal of the logic gate.

Example 2 includes the apparatus of example 1, wherein the current mirror includes a third transistor including a first current terminal, a second current terminal, and a gate terminal, the first current terminal of the third transistor coupled to the first terminal of the current mirror, and a fourth transistor including a first current terminal, a second current terminal, and a gate terminal, the second current terminal of the fourth transistor coupled to the second terminal of the current mirror, and the gate terminal of the fourth transistor coupled to the gate terminal of the third transistor.

Example 3 includes the apparatus of example 2, wherein the first current terminal of the third transistor is coupled to the gate terminal of the third transistor.

Example 4 includes the apparatus of example 1, wherein the current mirror is configured to boost a bit current obtained from the memory.

Example 5 includes the apparatus of example 1, wherein the logic gate further includes an output terminal configured to be coupled to a computing system.

Example 6 includes the apparatus of example 1, wherein the first transistor further includes a gate terminal configured to be coupled to a controller.

Example 7 includes the apparatus of example 1, wherein the second transistor further includes a gate terminal configured to be coupled to a controller.

Example 8 includes the apparatus of example 1, wherein the logic gate is configured to compare a first current conducting through the current mirror and a second current conducting through the second transistor.

Example 9 includes the apparatus of example 8, wherein the first current is a bit current obtained from memory, and wherein the second current is a reference current.

Example 10 includes the apparatus of example 1, wherein the first transistor is configured to initialize the input terminal of the logic gate to be a logic low value.

Example 11 includes the apparatus of example 1, wherein the memory is rated for a first voltage, and wherein the current mirror, the first transistor, the second transistor, and the logic gate are rated for a second voltage.

Example 12 includes the apparatus of example 11, wherein the first voltage is greater than the second voltage.

Example 13 includes the apparatus of example 1, wherein the memory is a one-time-programmable (OTP) memory.

Example 14 includes a method to sense a memory, the method comprising initializing an output of a sensing circuit to be a first logic high value, obtaining, from the memory, a first current corresponding to a memory bit stored in the memory, replicating the first current, determining whether the replicated first current is greater than a second current, and in response to determining that the replicated first current is greater than the second current, generating a second logic high value at the output of the sensing circuit.

Example 15 includes the method of example 14, wherein the second current is a reference current.

Example 16 includes the method of example 14, wherein the output of the sensing circuit is initialized to the first logic high value by initializing an input of a logic gate to be a logic low value.

Example 17 includes the method of example 14, further including in response to determining the replicated first current is less than the second current, generating a logic low value at the output of the sensing circuit.

Example 18 includes the method of example 14, wherein the memory is a one-time-programmable (OTP) memory.

Example 19 includes the method of example 14, wherein the first current is replicated using a current mirror.

Example 20 includes the method of example 14, further including transmitting the second logic high value at the output of the sensing circuit to a computing system.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
    a current mirror including a first terminal and a second terminal, the first terminal configured to be coupled to a memory;
    a logic gate including an input terminal coupled to the second terminal of the current mirror;
    a first transistor including a first current terminal and second current terminal, the first current terminal of the first transistor coupled to the input terminal of the logic gate, the second current terminal of the first transistor coupled to a ground rail; and
    a second transistor including a first current terminal and a second current terminal, the first current terminal of the second transistor configured to be coupled to a power rail, the second current terminal of the second transistor coupled to the input terminal of the logic gate.

2. The apparatus of claim 1, in which the current mirror includes a third transistor including a first current terminal, a second current terminal, and a gate terminal, the first current terminal of the third transistor coupled to the first terminal of the current mirror; and including a fourth transistor including a first current terminal, a second current terminal, and a gate terminal, the second current terminal of the fourth transistor coupled to the second terminal of the current mirror, and the gate terminal of the fourth transistor coupled to the gate terminal of the third transistor.

3. The apparatus of claim 2, in which the first current terminal of the third transistor is coupled to the gate terminal of the third transistor.

4. The apparatus of claim 1, in which the current mirror is configured to boost a bit current obtained from the memory.

5. The apparatus of claim 1, in which the logic gate further includes an output terminal configured to be coupled to a computing system.

6. The apparatus of claim 1, in which the first transistor further includes a gate terminal configured to be coupled to a controller.

7. The apparatus of claim 1, in which the second transistor further includes a gate terminal configured to be coupled to a controller.

8. The apparatus of claim 1, in which the logic gate is configured to compare a first current conducting through the current mirror and a second current conducting through the second transistor.

9. The apparatus of claim 8, in which the first current is a bit current obtained from the memory, and wherein the second current is a reference current.

10. The apparatus of claim 1, in which the first transistor is configured to initialize the input terminal of the logic gate to be a logic low value.

11. The apparatus of claim 1, in which the memory is rated for a first voltage, and wherein the current mirror, the first transistor, the second transistor, and the logic gate are rated for a second voltage.

12. The apparatus of claim 11, in which the first voltage is greater than the second voltage.

13. The apparatus of claim 1, in which the memory is a one-time-programmable (OTP) memory.

14. A process of sensing a memory bit, the method comprising:
    initializing an output of a current mirror circuit to be a first logic low value from a ground rail;
    obtaining, from the memory, a first current corresponding to a memory bit stored in the memory;
    replicating the first current in the current mirror circuit;
    determining whether the replicated first current is greater than a second current from a power rail; and in response to determining that the replicated first current is greater than the second current, generating a second logic low value at the output of the current mirror circuit and a logic high value at the output of a sensing circuit coupled to the current mirror circuit.

15. The process of claim 14, in which the second current is a reference current.

16. The process of claim 14, in which the output of the sensing circuit is initialized to the logic high value by initializing an input of a logic gate to be a logic low value.

17. The process of claim 14, including in response to determining the replicated first current is less than the second current, generating a logic low value at the output of the sensing circuit.

18. The process of claim 14, in which the memory is a one-time-programmable (OTP) memory.

19. The process of claim 14, in which the first current is replicated using a single current mirror circuit.

20. The process of claim 14, including transmitting the logic value at the output of the sensing circuit to a computing system.

21. A one-time-programmable memory comprising:
a controller and a decoder having word line outputs and bit line select outputs;
a first memory array including a first memory cell having an input coupled to a first word line and having an output coupled to a first bit line and including a second memory cell having an input coupled to a second word line and having an output coupled to the first bit line;
a second memory array including a third memory cell having an input coupled to the first word line and having an output coupled to a second bit line, and a fourth memory cell having an input coupled to the second word line and an output coupled to the second bit line;
a multiplexor having a control input coupled to the bit line select outputs, having a first input coupled to the first bit line, having a second input coupled to the second bit line, and having a multiplexer output; and
a sensing circuit including:
a current mirror including a first terminal coupled to the multiplexer output and a second terminal;
a logic gate including an input terminal coupled to the second terminal of the current mirror;
a first transistor including a first current terminal and second current terminal, the first current terminal of the first transistor coupled to the input terminal of the logic gate, the second current terminal of the first transistor coupled to a ground rail; and
a second transistor including a first current terminal and a second current terminal, the first current terminal of the second transistor being coupled to a power input, the second current terminal of the second transistor coupled to the input terminal of the logic gate.

22. The one-time-programmable memory of claim 21, in which the current mirror includes a third transistor including a first current terminal, a second current terminal, and a gate terminal, the first current terminal of the third transistor being coupled to the first terminal of the current mirror; and including a fourth transistor including a first current terminal, a second current terminal, and a gate terminal, the second current terminal of the fourth transistor being coupled to the second terminal of the current mirror, and the gate terminal of the fourth transistor being coupled to the gate terminal of the third transistor.

23. The one-time-programmable memory of claim 22, in which the first current terminal of the third transistor is coupled to the gate terminal of the third transistor.

24. The one-time-programmable memory of claim 21, in which the current mirror is configured to boost a bit current obtained from the multiplexer output.

25. The one-time-programmable memory of claim 21, in which the logic gate includes an output terminal coupled to a computing system.

26. The one-time-programmable memory of claim 21, in which the first transistor includes a gate terminal coupled to a controller.

27. The one-time-programmable memory of claim 21, in which the second transistor includes a gate terminal coupled to the controller.

28. The one-time-programmable memory of claim 21, in which the logic gate is configured to compare a first current conducting through the current mirror and a second current conducting through the second transistor.

29. The one-time-programmable memory of claim 28, in which the first current is a bit current obtained from the multiplexer output, and the second current is a reference current.

30. The one-time-programmable memory of claim 21, in which the first transistor is configured to initialize the input terminal of the logic gate to be a logic low value.

31. The one-time-programmable memory of claim 21, in which the memory arrays are rated for a first voltage, and in which the current mirror, the first transistor, the second transistor, and the logic gate are rated for a second voltage.

32. The one-time-programmable memory of claim 31, in which the first voltage is greater than the second voltage.

33. A system comprising:
a computing system having a memory input; and
a one-time-programmable memory including:
a controller and a decoder having word line outputs and bit line select outputs;
a first memory array including a first memory cell having an input coupled to a first word line and having an output coupled to a first bit line and including a second memory cell having an input coupled to a second word line and having an output coupled to the first bit line;
a second memory array including a third memory cell having an input coupled to the first word line and having an output coupled to a second bit line, and a fourth memory cell having an input coupled to the second word line and an output coupled to the second bit line;
a multiplexor having a control input coupled to the bit line select outputs, having a first input coupled to the first bit line, having a second input coupled to the second bit line, and having a multiplexer output; and
a sensing circuit including:
a current mirror including a first terminal coupled to the multiplexer output and a second terminal;
a logic gate including an input terminal coupled to the second terminal of the current mirror and having a logic output coupled to the memory input;
a first transistor including a first current terminal and second current terminal, the first current terminal of the first transistor coupled to the input terminal of the logic gate, the second current terminal of the first transistor coupled to a ground rail; and
a second transistor including a first current terminal and a second current terminal, the first current terminal of the second transistor being coupled to a power input, the second current terminal of the second transistor coupled to the input terminal of the logic gate.

34. The system of claim 33, in which the current mirror includes a third transistor including a first current terminal, a second current terminal, and a gate terminal, the first current terminal of the third transistor being coupled to the first terminal of the current mirror; and including a fourth transistor including a first current terminal, a second current terminal, and a gate terminal, the second current terminal of the fourth transistor being coupled to the second terminal of the current mirror, and the gate terminal of the fourth transistor being coupled to the gate terminal of the third transistor.

35. The one-time-programmable memory of claim 34, in which the first current terminal of the third transistor is coupled to the gate terminal of the third transistor.

36. The one-time-programmable memory of claim 33, in which the current mirror is configured to boost a bit current obtained from the multiplexer output.

37. The one-time-programmable memory of claim 33, in which the logic gate includes an output terminal coupled to a computing system.

38. The one-time-programmable memory of claim 33, in which the first transistor includes a gate terminal coupled to a controller.

39. The one-time-programmable memory of claim 33, in which the second transistor includes a gate terminal coupled to the controller.

40. The one-time-programmable memory of claim 33, in which the logic gate is configured to compare a first current conducting through the current mirror and a second current conducting through the second transistor.

41. The one-time-programmable memory of claim 40, in which the first current is a bit current obtained from the multiplexer output, and the second current is a reference current.

42. The one-time-programmable memory of claim 33, in which the first transistor is configured to initialize the input terminal of the logic gate to be a logic low value.

43. The one-time-programmable memory of claim 33, in which the memory arrays are rated for a first voltage, and in which the current mirror, the first transistor, the second transistor, and the logic gate are rated for a second voltage.

44. The one-time-programmable memory of claim 43, in which the first voltage is greater than the second voltage.

* * * * *